US012602530B2

(12) United States Patent
Drane et al.

(10) Patent No.: US 12,602,530 B2
(45) Date of Patent: Apr. 14, 2026

(54) APPARATUS, DEVICE, METHOD AND COMPUTER PROGRAM FOR GENERATING A CIRCUIT DESIGN OF POLYNOMIAL INTERPOLATION HARDWARE

(71) Applicant: Intel Corporation, Santa Clara, CA (US)

(72) Inventors: Theo Drane, El Dorado Hills, CA (US); Bryce Orloski, State College, PA (US)

(73) Assignee: Intel Corporation, Santa Clara, CA (US)

( * ) Notice: Subject to any disclaimer, the term of this patent is extended or adjusted under 35 U.S.C. 154(b) by 874 days.

(21) Appl. No.: 17/656,438

(22) Filed: Mar. 25, 2022

(65) Prior Publication Data

US 2022/0222413 A1     Jul. 14, 2022

(51) Int. Cl.
*G06F 30/392* (2020.01)

(52) U.S. Cl.
CPC .................................. *G06F 30/392* (2020.01)

(58) Field of Classification Search
CPC .... G06F 30/392; G06F 9/3001; G06F 1/0356; G06F 7/57; G06F 7/721; G06F 9/30; G06F 7/49905; G06F 3/1203; G06F 18/21; G06F 3/04897; G06F 3/1267; G06F 9/30167; G06F 9/381; G06F 9/3836; G03F 7/70058; G03F 1/36; G03F 7/705; H03L 7/191; H01L 24/03; H01L 24/48; H01L 2225/06506; H01L 2225/06548; H01L 24/92
USPC .................................................. 716/118–125
See application file for complete search history.

(56) References Cited

U.S. PATENT DOCUMENTS

| | | | | |
|---|---|---|---|---|
| 9,170,776 | B2 * | 10/2015 | Azadet .................... | G06F 1/035 |
| 2016/0380653 | A1 * | 12/2016 | Sheikh ................ | H04B 1/0475 |
| | | | | 370/282 |
| 2019/0187715 | A1 * | 6/2019 | Zhang .................. | G05D 1/0268 |

OTHER PUBLICATIONS

Florent De Dinechin: "Building Custom Arithmetic Operators with the FloPoCo Generator", HiPEAC Conference , Jan. 22, 2013.
S. Chevillard et al.: "Sollya: an enviroment for the development of numerical codes", Mathematical Software—ICMS 2010, pp. 28-31, Heidelberg, Germany, Sep. 2010. Springer.

* cited by examiner

*Primary Examiner* — Binh C Tat
(74) *Attorney, Agent, or Firm* — SPL Patent Attorneys PartG mbB; Kieran O'Leary

(57) ABSTRACT

Examples relate to an apparatus, a device, a method, and a computer program for generating a circuit design of polynomial interpolation hardware. The apparatus comprises processing circuitry configured to sub-divide the range of input values of the polynomial interpolation hardware into a plurality of regions, determine, for each region of the plurality of regions, a set of polynomial approximations that are suitable in view of a desired accuracy of the polynomial interpolation hardware, remove, based on one or more user-defined objectives, polynomial approximations from the respective sets of polynomial approximations, and generate the circuit design of the polynomial interpolation hardware based on one polynomial approximation per region remaining in the respective sets of polynomial approximations after the iterative removal of polynomial approximations.

21 Claims, 8 Drawing Sheets

SUB-DIVIDING BITS OF AN INPUT VALUE ⟍ 110

SUB-DIVIDING THE RANGE OF INPUT VALUES INTO REGIONS ⟍ 120

DETERMINING, FOR EACH REGION, A SET OF POLYNOMIAL APPROXIMATIONS ⟍ 130

DETERMINING COEFFICIENTS ⟍ 135

REMOVING POLYNOMIAL APPROXIMATIONS FROM THE RESPECTIVE SETS OF POLYNOMIAL APPROXIMATIONS ⟍ 140

GENERATING A CIRCUIT DESIGN BASED ON ONE POLYNOMIAL APPROXIMATION PER REGION ⟍ 150

The input, in binary is:

0.XXXX

APPARATUS, DEVICE, METHOD AND COMPUTER PROGRAM FOR GENERATING A CIRCUIT DESIGN OF POLYNOMIAL INTERPOLATION HARDWARE

BACKGROUND

Hardware to compute complex functions, e.g., sine, cosine, which have no binary finite representation, often makes use of polynomial interpolation. The degree and number of polynomials used to approximate a complex function depends on the required precision of the approximation, but for single precision, quadratic interpolation schemes are commonplace.

Polynomial interpolation slices the input domain into a number of regions and uses a different polynomial to approximate the function in each region. In academia, a modified Remez algorithm was used to generate polynomial interpolations to such complex functions. However, such a modified Remez algorithm does not target achieving the minimal number of possible polynomials and finds "close to" minmax polynomials, which minimize the maximum error in the approximation. Moreover, curve-fitting based approaches do not fully explore the design space and may therefore be unsuitable for finding a solution that minimizes the size of the resulting hardware, such as the size of a look-up table being used to store the coefficients of the polynomials.

BRIEF DESCRIPTION OF THE FIGURES

Some examples of apparatuses and/or methods will be described in the following by way of example only, and with reference to the accompanying figures, in which.

DETAILED DESCRIPTION

Figure 1A:
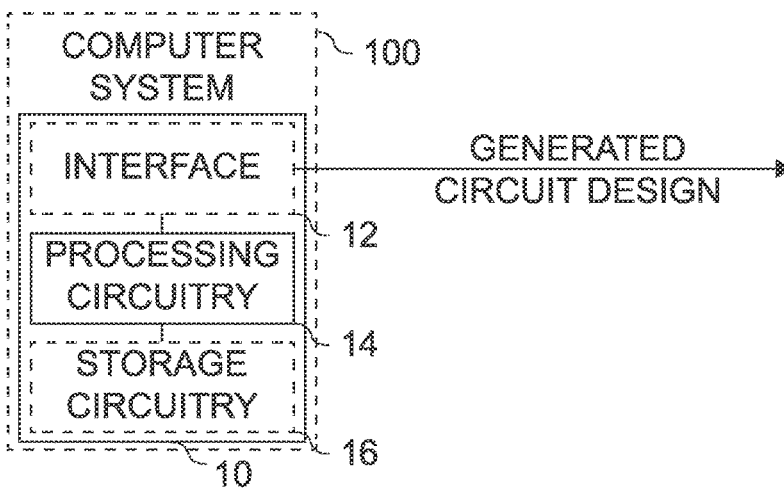
FIG. 1a shows a block diagram of an example of an apparatus or device for generating a circuit design of polynomial interpolation hardware, and of a computer system comprising such an apparatus or device.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e., only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

In the following description, specific details are set forth, but examples of the technologies described herein may be practiced without these specific details. Well-known circuits, structures, and techniques have not been shown in detail to avoid obscuring an understanding of this description. "An example/example," "various examples/examples," "some examples/examples," and the like may include features, structures, or characteristics, but not every example necessarily includes the particular features, structures, or characteristics.

Some examples may have some, all, or none of the features described for other examples. "First," "second," "third," and the like describe a common element and indicate different instances of like elements being referred to. Such adjectives do not imply element item so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact.

As used herein, the terms "operating", "executing", or "running" as they pertain to software or firmware in relation to a system, device, platform, or resource are used interchangeably and can refer to software or firmware stored in one or more computer-readable storage media accessible by the system, device, platform or resource, even though the instructions contained in the software or firmware are not actively being executed by the system, device, platform, or resource.

The description may use the phrases "in an example/example," "in examples/examples," "in some examples/examples," and/or "in various examples/examples," each of which may refer to one or more of the same or different examples. Furthermore, the terms "comprising," "including," "having," and the like, as used with respect to examples of the present disclosure, are synonymous.

FIG. 1a shows a block diagram of an example of an apparatus 10 or device 10 for generating a circuit design of polynomial interpolation hardware, and of a computer system 100 comprising such an apparatus 10 or device 10. The apparatus 10 comprises circuitry that is configured to provide the functionality of the apparatus 10. For example, the apparatus 10 of FIGS. 1a and 1b comprises (optional) interface circuitry 12, processing circuitry 14 and (optional) storage circuitry 16. For example, the processing circuitry 14 may be coupled with the interface circuitry 12 and with the storage circuitry 16. For example, the processing circuitry 14 may be configured to provide the functionality of the apparatus, in conjunction with the interface circuitry 12 (for exchanging information, e.g., with other components of the computer system) and the storage circuitry 16 (for storing information). Likewise, the device 10 may comprise means that is/are configured to provide the functionality of the device 10. The components of the device 10 are defined as component means, which may correspond to, or implemented by, the respective structural components of the apparatus 10. For example, the device 10 of FIGS. 1a and 1b comprises means for processing 14, which may correspond to or be implemented by the processing circuitry 14, (optional) means for communicating 12, which may correspond to or be implemented by the interface circuitry 12, and (optional) means for storing information 16, which may correspond to or be implemented by the storage circuitry 16.

The processing circuitry or means for processing 14 is configured to sub-divide the range of input values of the polynomial interpolation hardware into a plurality of regions. The processing circuitry or means for processing 14 is configured to determine, for each region of the plurality of regions, a set of polynomial approximations that are suitable in view of a desired accuracy of the polynomial interpolation hardware. The processing circuitry or means for processing 14 is configured to remove (e.g., iteratively remove), based on one or more user-defined objectives, polynomial approximations from the respective sets of polynomial approximations. The processing circuitry or means for processing 14 is configured to generate the circuit design of the polynomial interpolation hardware based on one polynomial approximation per region remaining in the respective sets of polynomial approximations after the iterative removal of polynomial approximations.

Figure 1B:
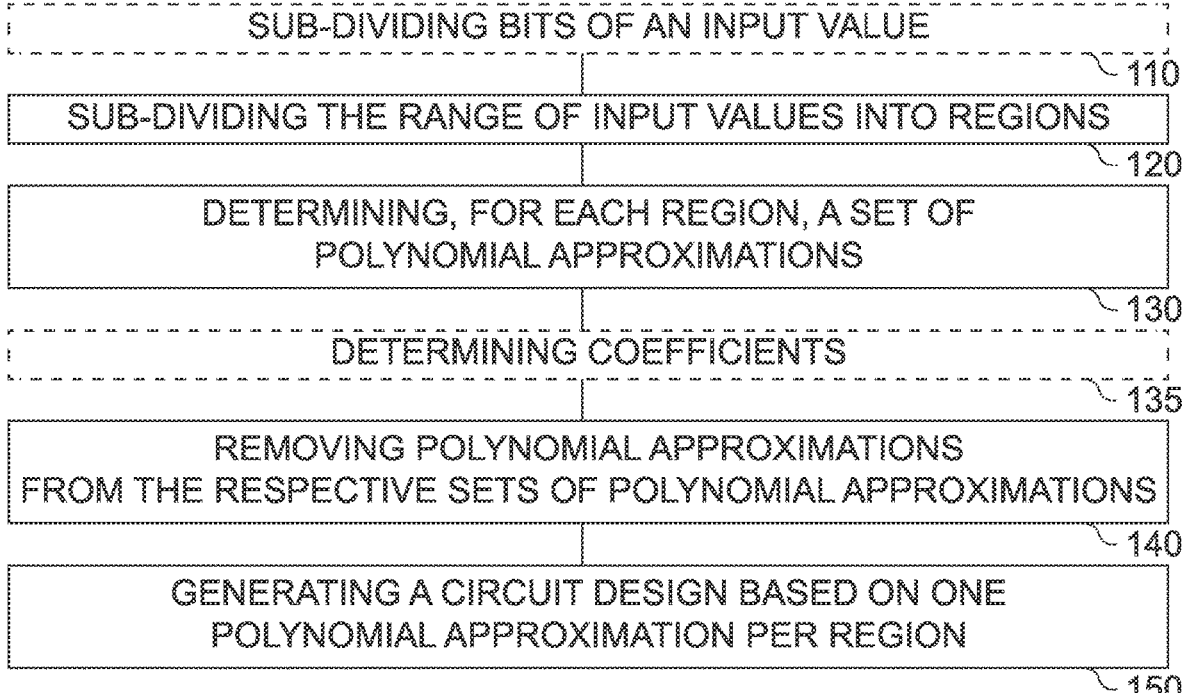
FIG. 1b shows a flow chart of an example of a method for generating a circuit design of polynomial interpolation hardware.

FIG. 1b shows a flow chart of an example of a corresponding (computer-implemented) method for generating a circuit design of polynomial interpolation hardware. The method further comprises sub-dividing 120 the range of input values of the polynomial interpolation hardware into a plurality of regions. The method comprises determining 130, for each region of the plurality of regions, a set of polynomial approximations that are suitable in view of a desired accuracy of the polynomial interpolation hardware. The method comprises removing 140, e.g., iteratively removing, based on one or more user-defined objectives, polynomial approximations from the respective sets of polynomial approximations. The method comprises generating 150 the circuit design of the polynomial interpolation hardware based on one polynomial approximation per region remaining in the respective sets of polynomial approximations after the iterative removal of polynomial approximations.

For example, the method may be performed by the computer system 100, e.g., by the processing circuitry or means for processing 14 of the apparatus or device 10 shown in FIG. 1a. In the following, the features of the computer system 100, apparatus 10, device 10, method and computer program are introduced with reference to the computer system 100 and apparatus 10. Features introduced in connection with the computer system 100 and apparatus 10 may likewise be included in the corresponding device 10, method and computer system.

In the following, a two-phase process is proposed for generating a circuit design for polynomial interpolation hardware, with a first phase, where possible implementations are collected (in the form of sets of polynomial approximations), and a second phase, where polynomial approximations are successively removed again, with the purpose of obtaining a circuit design that is improved according to the user-defined objective(s). In the following, the terms "improved" and "optimized" are used interchangeably. The term "optimized", or "optimization" does not necessarily imply that the result of the process is the optimal version. In the present concept, the term "optimized" indicates that some thing (e.g., the circuit design or a polynomial approximation) is superior to the initial version of the thing (e.g., the circuit design or polynomial interpolation).

The process starts with building up the design space, by generating a large number of feasible designs. In this context, feasible means that these designs can be used to generate circuit design of a polynomial interpolation hardware that has a desired accuracy. In the proposed concept, the desired accuracy of the polynomial interpolation hardware defines the guideposts or goalposts, which allow the selection of polynomial approximations and/or tradeoffs with respect to other components that improve the hardware (e.g., with respect to silicon area, delay etc.) while still yielding a circuit design that satisfies the desired accuracy.

In general, polynomial interpolation hardware is used to calculate an approximation of a result of a pre-determined function. For example, the polynomial interpolation hardware may take the input value of the function as input and provide the result of the function as output. In hardware design, such polynomial interpolation hardware has defined capabilities, such as the aforementioned desired (or minimal) accuracy, and a supported range of input values. In general, polynomial interpolation hardware is used to approximate complex functions, such as sine, cosine, or reciprocal functions, which would be expensive or infeasible to calculate in hardware (at least in real-time). Instead of using an accurate calculation of the function, an approximation is calculated, which still provides the desired accuracy. To be more precise, the concept of piecewise approximations is used, where the function being approximated by the polynomial interpolation hardware is not approximated using a single other function, but using a plurality of other functions, and in particular (linear or quadratic) polynomials, that each approximate the function in a given region of the range of input values. This concept is illustrated in connection with FIGS. 2a and 2b, for example.

In the proposed concept, these polynomial approximations are determined for the respective regions of the range of input values (or input range) of the polynomial interpolation hardware. The processing circuitry 14 is configured to sub-divide the range of input values of the polynomial interpolation hardware into a plurality of regions. The subdivision of the range of input values defines the number of polynomials used to approximate the function implemented by the polynomial interpolation hardware—the more regions, the more complex (and costly) the hardware becomes. On the other hand—the fewer regions, the harder it is to find polynomials that can be used to approximate the function accurately enough. In the proposed concept, the range of input values may be sub-divided such, that, for each region, at least one polynomial approximations exists that models the function accurately, while, on the other hand, the number of regions are reduced or minimized.

In the following, this concept is illustrated with respect to the hardware being used inside the polynomial interpolation hardware. In general, as shown in FIGS. 2b, 3a and 3b, the polynomial interpolation hardware may comprise a look-up-table (LUT 210 in FIG. 2b, 310 in FIGS. 3a and 3b), a computational block for determining a square of a term (if square polynomials are used, 320 in FIGS. 3a and 3b), and a computational block for determining a multiplication (220 in FIG. 2b, 330 in FIGS. 3a and 3b). In general, the approximation of the function is calculated based on a combination of the blocks, with the multiplication block taking inputs from the LUT, from the optional square component, and directly from the input value. For example, when using linear polynomials, as shown in FIG. 2b, the multiplication block may be configured to calculate $(a \cdot x + b) >> k$ (right-shift by $k$ bits), with the LUT providing coefficients $a$ and $b$, and $x$ being derived directly from the input value. When using quadratic polynomials (or quadratic and linear polynomials), as shown in FIGS. 3a and 3b, the multiplication block may be configured to calculate $(a \cdot s + b \cdot x + c) >> k$, with the LUT providing coefficients $a$, $b$, $c$, $x$ being derived from the input value and $s$ being provided by the square component. For example, the polynomial approximations being used for the circuit design may define entries of the LUT used in the polynomial interpolation hardware. Accordingly, the plurality of polynomials may be defined by the three coefficients $a$, $b$, and $c$, with the plurality of polynomials having the form of $ax^2 + bx + c >> k$, with $k$ defining an extent of a bit-shift applied on the polynomial, the bit-shift having an influence on the precision of an evaluation of the polynomial. Alternatively, if only linear polynomial approximations are used, the plurality of polynomials may be defined by the coefficients $a$ and $b$, and $c$, with the plurality of polynomials having the form of $ax + b >> k$. For example, the coefficients ($a$, $b$, and optionally $c$) may define entries of the LUT used by the polynomial interpolation hardware.

However, both $x$ and $s$ might not be determined based on the full input value—instead, the input value may be sub-divided into two ranges—a first range $r$ (comprising the most significant bits) and a second range $w$ (comprising the least significant bits). For example, an input value of the polynomial interpolation hardware may have a pre-defined bit-width (which may also define the range of input values, such that the range of input values is representable by the pre-defined bit-width. The processing circuitry may be configured to sub-divide the bits of the input value into a first range of most significant bits $r$ and a second range of least significant bits $w$. Accordingly, the method may comprise sub-dividing 110 the bits of the input value into a first range of most significant bits $r$ and a second range of least significant bits $w$. Of these ranges, the first range $r$ may be used as key for the LUT ($r$ bits, i.e., the bits of the input value defined by $r$) may be used as key for the look-up table, and the second range $w$ may be used to determine $x$ and $s$. For example, $x$ may correspond to the bits of the input value defined by $w$. Moreover, the square term may be determined based on the bits of the input value defined by $w$ (as shown in FIG. 3a) or by the most significant bit in $w$ (as shown in FIG. 3b). This sub-division of the input value into the ranges may also affect the subdivision of the range of input values into regions: As $r$ bits are used as key to the LUT, the LUT may comprise $2^r$ entries and thus provide $2^r$ combinations of coefficients. Thus, the range of input values may be sub-divided into (up to) $2^r$ regions. In other words, the processing circuitry may be configured to sub-divide the range of input values of the polynomial interpolation hardware into the plurality of regions based on the first range of most significant bits $r$. Accordingly, the method may comprise sub-dividing 120 the range of input values of the polynomial interpolation hardware into the plurality of regions based on the first range of most significant bits $r$.

As outlined above, when sub-dividing the range of input values, care may be taken to choose a sub-division where, for each region, a suitable polynomial approximation can be found. To put it formally, the processing circuitry may be configured to sub-divide the bits of the input value such, that a combination of coefficients $a$, $b$ and $c$ and shift value $k$ exists that define suitable sets of polynomial approximations that cover the plurality of regions, with the processing circuitry being configured to determine the coefficients $a$, $b$ and $c$ based on the subdivision of the bits of the input value. Accordingly, the method may comprise sub-dividing 110 the bits of the input value such, that a combination of coefficients $a$, $b$ and $c$ and shift value $k$ exists that define suitable sets of polynomial approximations that cover the plurality of regions, with the coefficients $a$, $b$ and $c$ being determined based on the sub-division of the bits of the input value. In this context, "suitable" means that the respective sets of polynomial approximations each comprise at least one polynomial approximation that provides the desired accuracy for the region associated with the set of polynomial approximations. In general, the respective sets of polynomial approximations might each only comprise polynomial approximations that provide the desired accuracy for the region associated with the set of polynomial approximations. Consequently, "suitable" means that none of the sets is empty.

It is evident, that the determination of $r$, and thus the sub-division of the range of input values, is intertwined with the generation of the sets of polynomial approximations. For example, first, a suitable (e.g., minimal) value for $r$ may be determined (which may comprise attempting to find at least one polynomial approximation for each region defined by $r$). Then, (all of) the possible values of $a$ are generated, then, for each region and each $a$, (all of) the possible values of $b$ may be generated, and, for each region, $a$ and $b$, (all of) the possible values for $c$ may be found. Again, for each coefficient, "suitable" values are found, with suitable values being such that they define a polynomial approximation that satisfies the desired accuracy of the polynomial interpolation hardware in the respective region of the plurality of regions. More broadly, polynomial approximations that are suitable in view of a desired accuracy of the polynomial interpolation hardware are polynomial approximations that satisfy, within their respective region, the desired accuracy of the polynomial interpolation hardware (by matching the function closely enough to yield at least the desired accuracy.

As outlined above, the proposed concept can be applied at least on linear polynomials and square polynomials. Accordingly, the processing circuitry may be configured to determine, for each region of the plurality of regions, a set of linear and/or quadratic polynomial approximations that are suitable in view of a desired accuracy of the polynomial interpolation hardware. Accordingly, the method may comprise determining 130, for each region of the plurality of regions, a set of linear and/or quadratic polynomial approximations that are suitable in view of a desired accuracy of the polynomial interpolation hardware.

To determine suitable coefficients, mathematical theory may be used. For example, the processing circuitry may be configured to determine the coefficients $a$, $b$ and $c$ and shift value k based on three inequalities defining ranges of possible values for coefficients a, b and c and shift value k, with the inequalities being defined by lower bounds and upper bounds being based on the desired accuracy of the polynomial interpolation hardware. Accordingly, the method may comprise determining 135 the coefficients a, b and c and shift value k based on the three inequalities. Suitable inequalities are shown in connection with FIGS. 2a to 8, and in particular in connection with FIGS. 3a to 4. For example, the following inequalities may be used (for determining quadratic polynomials):

$$\text{Find } a \text{ and } k: \max_{t<s} \frac{M(s)-m(t)}{s-t} < \frac{a}{2^k} < \min_{t<s} \frac{m(s)-M(t)}{s-t}$$

$$\text{Find } b: \max_t 2^k M(t) - at < b < \min_t 2^k m(t) - at$$

$$\text{Find } c: \max_x 2^k l(R+x) - ax^2 - bx \le c < \min_x 2^k (p(R+x)+1) - ax^2 - bx$$

Figure 3A:
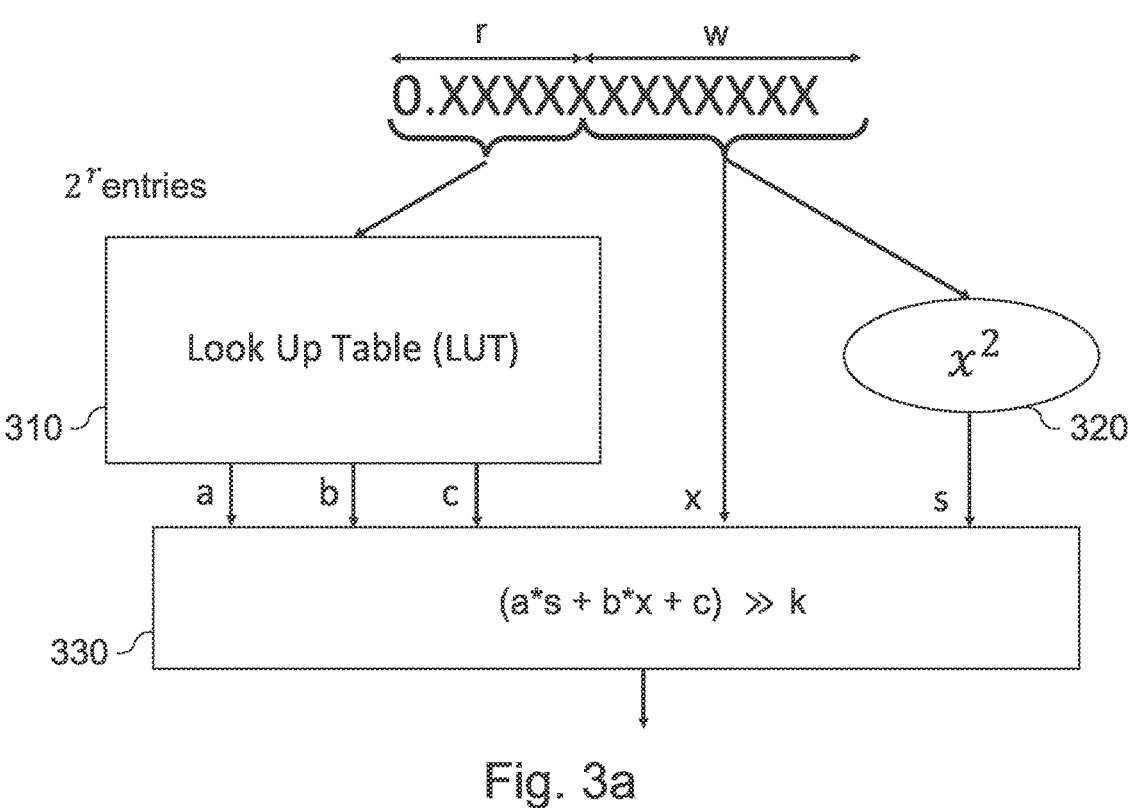
FIGS. 3 and 3b show schematic diagrams of components of polynomial interpolation hardware for evaluating a function using quadratic polynomials according to examples.
Figure 3B:
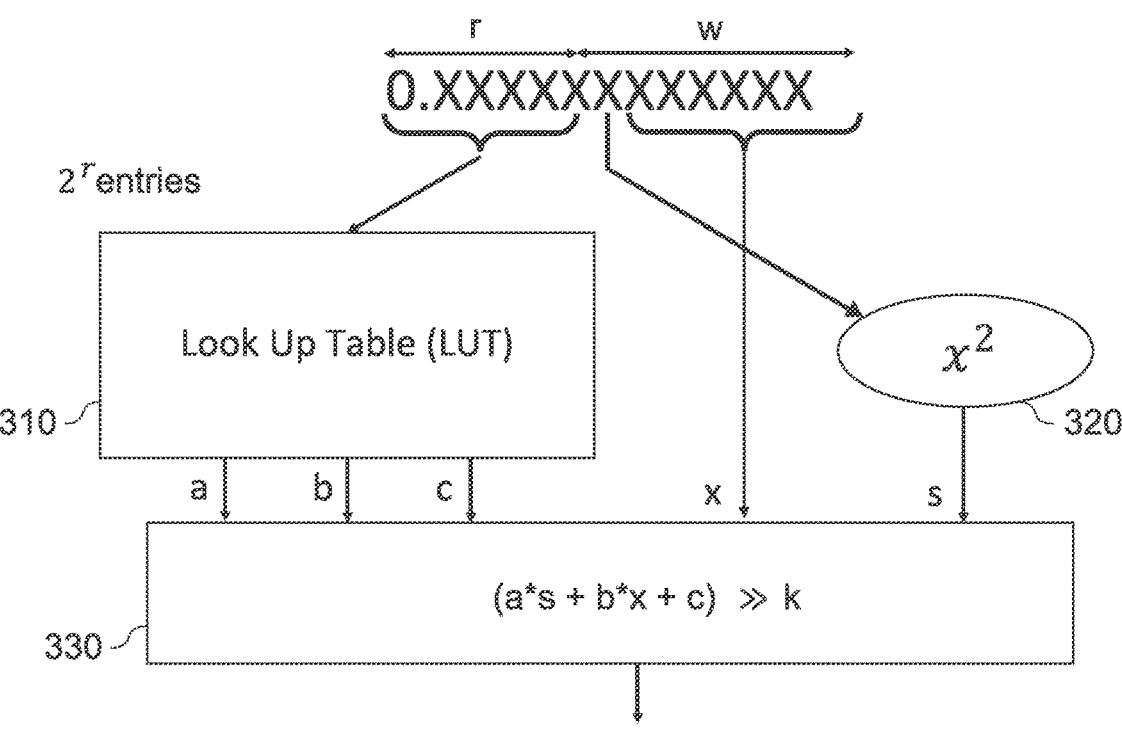
Figure 4:
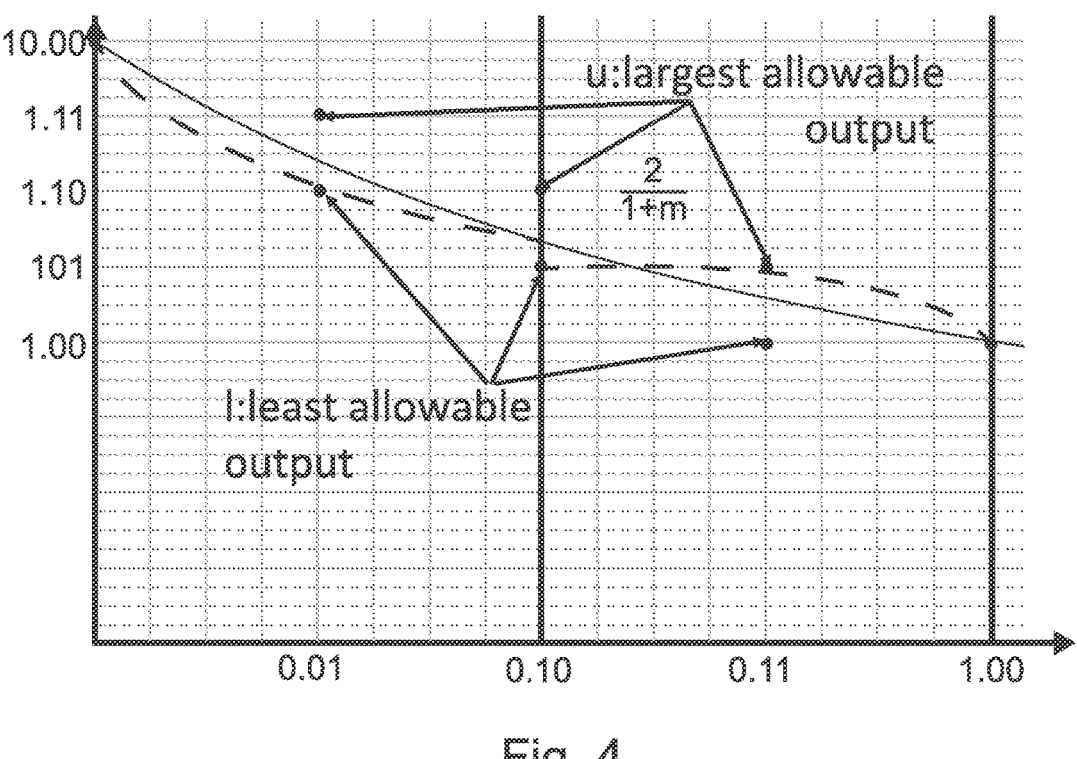
FIG. 4 shows an example of how polynomials fit between an upper and a lower bound.

The respective terms of the inequalities are introduced in connection with FIGS. 3a to 4.

As outlined above, first r may be calculated, and, based on r, suitable values for a, b, c may be determined. For example, the processing circuitry may be configured to determine a plurality of values for coefficient a, to determine for each value of coefficient a a plurality of values for coefficient b, and for each combination of coefficients a and b a plurality of values for coefficient c, with each combination of a, b and c defining a polynomial approximation. Accordingly, the method may comprise determining 135 a plurality of values for coefficient a, to determine for each value of coefficient a a plurality of values for coefficient b, and for each combination of coefficients a and b a plurality of values for coefficient c, with each combination of a, b and c defining a polynomial approximation. In some examples, the search for coefficients may be cut short using a technique illustrated in connection with FIG. 5.

These sets of polynomial approximations define the design space. In other words, the sets of polynomial approximations may define an overall design space of the circuit design of the polynomial interpolation hardware. Once the design space is defined, improvements and optimizations may be applied, which iteratively limit the design space again. In particular, improvements and optimizations are iteratively applied on the various components of the polynomial interpolation hardware, which limit which polynomial approximations are still suitable, as the improvements and optimizations generally reduce the overall accuracy of the polynomial interpolation hardware. In other words, the application of a user-defined objective (to improve or optimize the circuit design) may reduce an overall accuracy of the polynomial interpolation hardware, so that the polynomial approximations that are suitable in view of the desired accuracy of the polynomial interpolation hardware are limited by the overall accuracy of the polynomial interpolation hardware. In effect, not all of the polynomial approximations previously identified are suitable any more in view of the desired accuracy and are removed from the respective sets of polynomial approximations, by (iteratively) removing, based on one or more user-defined objectives, polynomial approximations from the respective sets of polynomial approximations. In other words, the design space may be gradually decreased by (iteratively) removing the polynomial approximations from the respective sets of polynomial approximations.

In the proposed concept, the circuit design is improved or optimized according to the user-defined objective(s). In general, such user-defined objectives target at least one of two areas—implementation complexity (e.g., with respect to silicon area, use of fixed-function hardware etc.) and processing delay (which determines the maximal clock speed). For example, the one or more user-defined objectives may be based on one or more of an area required for implementing components of the polynomial interpolation hardware, a processing delay of components of the polynomial interpolation hardware, and an availability of fixed-function hardware for implementing components of the polynomial interpolation hardware. However, the impact of changes to the various components of the polynomial interpolation hardware may be different depending on the hardware platform (e.g., depending on the building blocks available from the IP (Intellectual Property) library used for generating the circuitry design). Accordingly, the one or more user-defined objectives are based on, e.g., tailored to, properties of a target hardware platform.

As outlined above, user-defined objectives may target at least one of two areas—implementation complexity and processing delay. Both can be influenced by changing, and in particular, reducing the complexity and/or width of components of the polynomial interpolation hardware. For example, the one or more user-defined objectives may relate to reducing a width or complexity of at least one of the look-up-table, the computational block for calculating the square of the term, and the computational block for calculating the multiplication of the polynomial interpolation hardware. For example, such a reduction in complexity or width may be realized by reducing the number of bits being processed, or by internally truncating the respective hardware component. Examples of this are shown in connection with FIGS. 6 to 8. Correspondingly, the one or more user-defined objectives may relate to such reductions in complexity or width. For example, the one or more user-defined objectives may comprise at least one of an objective related to reducing an input width of the computational block for calculating the square of the term (which may reduce the complexity of the square component, at the expense of the accuracy of the determination of the square of w), an objective related to reducing a linear component input width of the computational block for calculating the multiplication (which may reduce the width, and thus complexity, of the multiplication block, at the expense of the overall accuracy), an objective related to reducing a width of entries of the look-up table (e.g., by selecting based on their number of trailing zeros, as shown in connection with FIG. 6, which may reduce the silicon area required for implementing the LUT, at the expense of the overall accuracy), and an objective related to reducing a precision of the computational block for calculating the multiplication (i.e., truncating the multiplication block). Another user-defined objective may relate to an objective related to reducing an extent of a bit shift performed by a bit-shifting component, which may reduce polynomial evaluation output size and size of multiplication arrays.

The proposed iterative process may be continued until it reaches a point where one of the sets of polynomial approximations would become empty as a result of an iterative improvement. At this point, a different iterative improvement (according to a user-defined objective) may be tried, or the process may be stopped, yielding a plurality of sets of polynomial approximations each comprising at least one polynomial approximation. To generate the circuit design, one polynomial approximation may be picked for each of the regions. The processing circuitry is configured to generate the circuit design of the polynomial interpolation hardware based on one polynomial approximation per region remaining in the respective sets of polynomial approximations after the iterative removal of polynomial approximations. These polynomial approximations define the LUT of the circuit design of the polynomial interpolation hardware. In addition to the LUT, the computational block for calculating the square and the computational block for calculating the multiplication, as modified during the iterative process based on the one or more user-defined objectives, may be used to generate the circuit design. For example, the processing circuitry may be configured to generate a register transfer level (RTL) representation of the circuit design, e.g., as Verilog or VHDL (Very High Speed Integrated Circuits Hardware Description Language) code, based on the LUT, the computational block for calculating the square and the computational block for calculating the multiplication. For example, the RTL representation of the circuit design may be subsequently synthesized to a netlist, and ultimately to a circuit design to be used for manufacturing the integrated circuit. For example, the processing circuitry may be configured to output the generated circuit design, e.g., via a computer-readable medium or via a signal comprising the respective RTL representation of the circuit design.

The interface circuitry 12 or means for communicating 12 may correspond to one or more inputs and/or outputs for receiving and/or transmitting information, which may be in digital (bit) values according to a specified code, within a module, between modules or between modules of different entities. For example, the interface circuitry 12 or means for communicating 12 may comprise circuitry configured to receive and/or transmit information.

For example, the processing circuitry 14 or means for processing 14 may be implemented using one or more processing units, one or more processing devices, any means for processing, such as a processor, a computer or a programmable hardware component being operable with accordingly adapted software. In other words, the described function of the processing circuitry 14 or means for processing may as well be implemented in software, which is then executed on one or more programmable hardware components. Such hardware components may comprise a general-purpose processor, a Digital Signal Processor (DSP), a micro-controller, etc.

For example, the storage circuitry 16 or means for storing information 16 may comprise at least one element of the group of a computer readable storage medium, such as a magnetic or optical storage medium, e.g., a hard disk drive, a flash memory, Floppy-Disk, Random Access Memory (RAM), Programmable Read Only Memory (PROM), Erasable Programmable Read Only Memory (EPROM), an Electronically Erasable Programmable Read Only Memory (EEPROM), or a network storage.

More details and aspects of the apparatus, device, method, and computer program for generating a circuit design of polynomial interpolation hardware are mentioned in connection with the proposed concept or one or more examples described above or below (e.g., FIGS. 2a to 8). The apparatus, device, method, and computer program for generating a circuit design of polynomial interpolation hardware may comprise one or more additional optional features corresponding to one or more aspects of the proposed concept, or one or more examples described above or below.

Various examples of the present disclosure relate to a concept for automatic generation of improved or optimal polynomial interpolation hardware. The proposed concept may be based on finding the (complete) design space of feasible Look-Up Tables (LUT) for quadratic and linear interpolation approximating a complex function to within a given error bound, and automatic generation of improved or optimal hardware based on this knowledge of the design space.

For example, the proposed concept may take input/output precisions (e.g., the desired accuracy of the polynomial interpolation hardware) along with upper and lower bounds (e.g., the range of input values) on the target function for the possible inputs. The input domain (i.e., the range of input values) is then divided into a number of intervals (regions). For each region, feasible linear or quadratic polynomials are being searched, namely those that fit between the upper and lower bounds across the interval. A short introduction of the infrastructure is given in FIGS. 3a to 3b.

In the following, a short introduction to the concept of piecewise polynomial interpolation is given. Piecewise polynomial interpolation is a common method for complex or transcendental function hardware. It provides an approach for creating hardware for approximating elementary functions, such as sine or reciprocal, with specified error bounds. Piecewise polynomial interpolation further enables hardware reuse for multiple functions and exploits hardware-efficient constructs such as multiplication and addition.

In piecewise polynomial approximation, any function may be sliced into regions, and each region may be approximated with a polynomial (e.g., a linear polynomial (e.g., $a \cdot x + b$) or a quadratic polynomial (e.g., $a \cdot x^2 + b \cdot x + c$)). However, a priori, the number of regions, whether the regions are to be equally sized, or whether linear or quadratic polynomials are to be used may now be known.

Figure 2A:
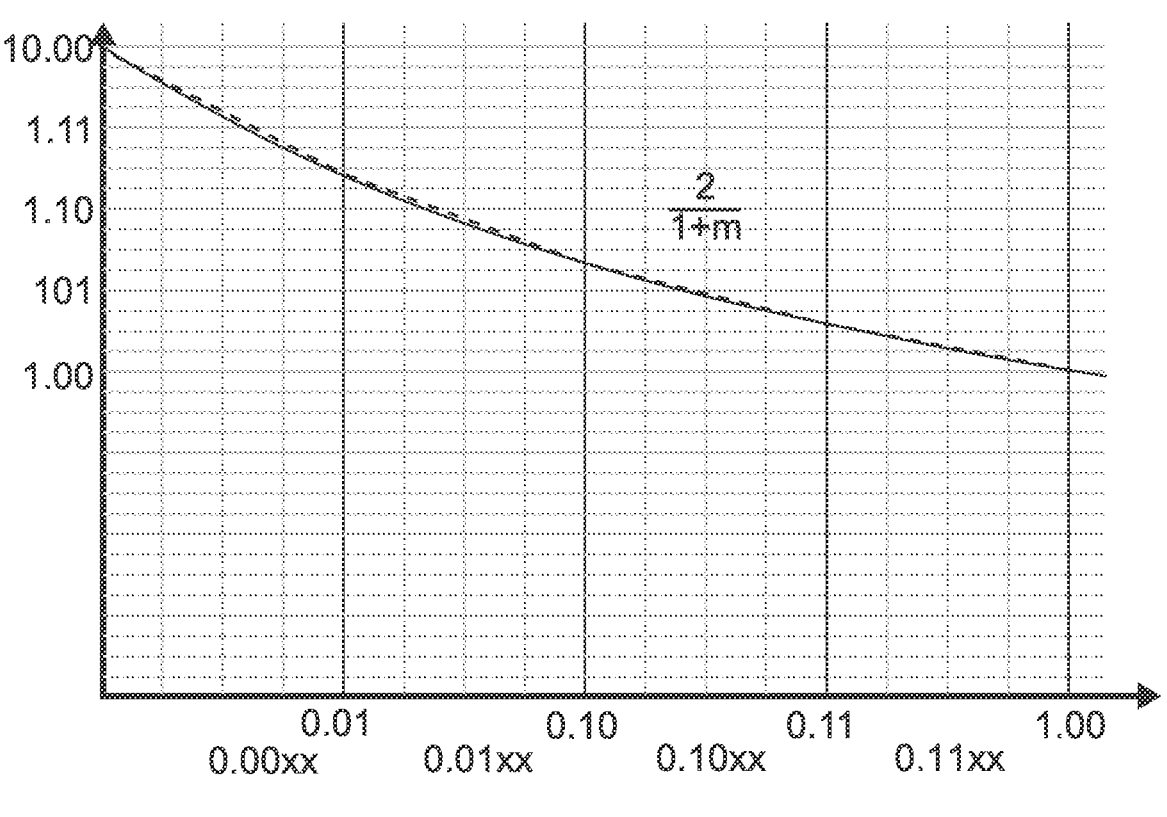
FIGS. 2a and 2b show an example of piecewise polynomial interpolation of a function using linear polynomials.
Figure 2B:
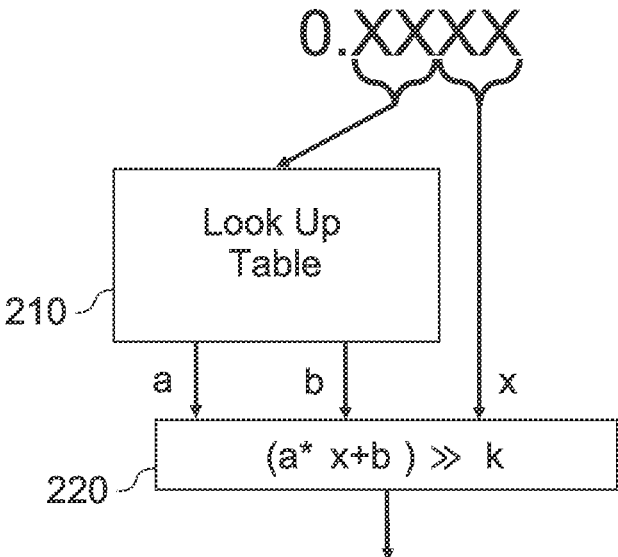

FIGS. 2a and 2b show an example of piecewise polynomial interpolation of a function using linear polynomials. In FIG. 2a, the function $$\left(\frac{2}{1+m}\right)$$

is shown as solid line, with the piecewise polynomials shown with the dashed lines. The input range is divided in four regions (up to 0.01, between 0.01 and 0.10, between 0.10 and 0.11, and between 0.11 and 1.00). Given the input, in binary, is 0.XXXX, two most significant bits (on the left towards the point) may determine the region, the remaining bits may be used in the polynomial. For example, as shown in FIG. 2a, the two most significant bits are used as key for look up table 210, to determine a and b, with the least significant bits being x, with the function being evaluated by $(a \cdot x + b) >> k$ 220, with k being the number of bits the result of $a \cdot x + b$ is bit-shifted to the right.

In FIGS. 3a and 3b, the same concept is shown for piecewise polynomial interpolation using quadratic polynomials. FIGS. 3 and 3b show schematic diagrams of components of polynomial interpolation hardware for evaluating a function using quadratic polynomials according to examples. In the figures, the architecture of the quadratic interpolation scheme is shown, where the top r bits of the input value determine the region and the bottom w bits are used to compute the polynomial. Similar, to FIG. 2b, the top r bits are used as key to a LUT 310 (having, at most, $2^r$ entries), providing coefficients a, b, c. In addition to the LUT, a square component 320 is used to determine the square s of the bottom w bits. Another component is used to determine the resulting function 330, $(a \cdot s + b \cdot x + c) >> k$, with x being generated from the bottom w bits. In some examples, as shown in FIG. 3b, the square s might only be determined based on the most significant bit of w.

In general, there are many approaches for making such designs. However, these approaches may leave some questions, such as what is the smallest possible LUT, how many regions could be linear, can the same a, b and c be used for multiple regions? Various examples of the present disclosure may address some of these questions, by evaluating the entire design space of the polynomial interpolation hardware. In an implementation, for a BFloat reciprocal function, a LUT with 50 LUT bits was shown to suffice, compared to a LUT of 80 LUT bits used by an approach that was based on the modified Remez algorithm.

Various examples of the present disclosure use mathematical theory to ensure that the complete design space of feasible piecewise quadratic approximations to a given function is generated. Various examples of proposed concept may produce mixed linear and quadratic polynomial approximations, generate the absolute minimum number of piecewise quadratics to meet the desired accuracy, and generate minimum height/width LUT and optimized hardware. The proposed concept may be used to improve or optimized hardware implementation since the complete design space of feasible interpolation schemes can be evaluated, allowing to target minimum area, delay, or some hybrid. For example, hardware generated using the proposed concept has been used within a ray tracing unit, offering a 29% area improvement and 40% delay improvement over a conventional design of a graphics unit. The technology may benefit many RTL (Register Transfer Layer) teams and could be used to automatically build complex functions in hardware. For example, the technology may be used in Electronic Design Automation (EDA) software for complex function requirements, producing improved or optimal implementations or offering users the opportunity to easily generate their own bespoke implementations.

In the following, the design space generation process is outlined. Polynomial interpolation slices the input domain into a number of regions and uses a different polynomial to approximate the function in each region. The following examples will deal with arbitrary fixed-point representations and generate 2r equally sized regions, for some r ∈ N, as the hardware to implement this is a Look-Up Table (LUT) taking the top r bits of the input. The architecture is shown in FIGS. 3a and 3b.

The process of generating a dictionary of all possible LUTs (of differing sizes) with the co-design of the quadratic polynomial evaluation part of the proposed concept. The result is (more) efficient hardware meeting a given error specification to approximate the target function.

In the following, the following methodology is used—a minimal value for r is calculated, for each region (with the regions depending on r), (all of) the possible values of a are generated, then, for each region and each a, (all of) the possible values of b are generated, and, for each region, a, and b, (all of) the possible values for c are found.

Given some $f: \mathbb{R} \to \mathbb{R}$, a fixed-point approximation mapping n.m→p.q. may be generated. Let: $X = x_{n-1} \ldots x_0.$ $x_{-1} \ldots x_{-m}$, with X being the input fixed-point value, $V = x_{n-1} \ldots x_0 x_{-1} \ldots x_{-m}$, with V being the integer value of this bitstring, $R = x_{n-1} \ldots x_{n-r} 0 \ldots 0$, with R being the top r bits of X which determine the region, $W = x_{n-r-1} \ldots x_{-m}$, with V=R+W, such that W are the w least significant bits of X, and $W' = \overline{x_{n-r-1}} \ldots x_{-m}$ (signed integer, simple interval translation). In the following, a fixed-point problem is transformed into an integer problem. Given an input X, a polynomial, $\text{LUT}(R) \to p_R$ is obtained, such that $f(X) \approx p_R$ (W').

The upper and lower bound functions produce integer outputs of width p+q and (must) satisfy $$l(R + W') \times 2^{-q} \le f(X) \le u(R + W') \times 2^{-q}$$

Using upper and lower bounds allow us to specify any error budget from the exact function, f, in either direction.

In some examples, the determination of the polynomial approximations (of the entire design space) may start by finding the minimum number of polynomials required, and thus r. Using a binary search starting from endpoints $r_{left}=0$ and $r_{right}=n+m$, it is determined whether r is large enough by determining for each of the $2^r$ regions, whether there exists a quadratic polynomial that fits between the upper and lower bound in that region. FIG. 4 provides a simple example, where the input domain has been split into two regions.

FIG. 4 shows an example of how polynomials fit between an upper and a lower bound, illustrating the concept of using upper and lower bounds. FIG. 4 shows points of u, which indicate the largest allowable output (i.e., the maximal values that the polynomial can take), and points of l, which indicate the least allowable output (i.e., the minimal values that the polynomial can take). The dashed line shows are polynomial candidates that fit between the upper and lower bounds. The solid line shows the exact function. In FIG. 4, the input domain is split into 2 regions (r=2).

For a given width r and a value R of the top r bits, let w=n+m−r. To determine whether there exist feasible quadratic coefficients (a, b, c, k), a sequence of inequalities, $\forall x \in [-2^{w-1}, 2^{w-1}-1]$ may be checked:

$$l(R + x) \le \left\lfloor \frac{ax^2 + bx + c}{2^k} \right\rfloor \le u(R + x) \tag{1}$$

$$l(R + x) \le \frac{ax^2 + bx + c}{2^k} < u(R + x) + 1$$

$$2^k l(R + x) - ax^2 - bx \le c < 2^k(u(R + x) + 1) - ax^2 - bx$$

If a feasible c exists, then for all x and y $(y \in [-2^{w-1}, 2^{w-1}-1])$:

$$2^k l(R + x) - ax^2 - bx < 2^k(u(R + y) + 1) - ay^2 - by$$

Rearranging, bounds on b can be written assuming x<y and letting $$d(x, y) = \frac{u(R + x) + 1 - l(R + y)}{x - y};$$

$$2^k d(x, y) - a(x + y) < b < 2^k d(y, x) - a(x + y) \tag{2}$$

Division by (x−y) is permitted due to the strict ordering on the elements, x<y.

If a feasible b exists, then for all x<y and q<z (q, z∈[−$2^{w-1}$,$2^{w-1}$−1]):

$$2^k d(x, y) - a(x + y) < 2^k d(z, u) - a(u + z). \qquad 5$$

This may be necessary and sufficient because k can be increased until integer b exists in the interval.

The necessary and sufficient conditions for a are now for all x<y,q<z:

$$x + y = q + z: d(x, y) < d(z, q)$$

and $$x + y < q + z: \frac{d(q, z) - d(y, x)}{q + z - x - y} < \frac{a}{2^k} < \frac{d(z, q) - d(x, y)}{q + z - x - y}$$

Division by (q+z−x−y) is permitted due to the strict ordering, x+y<q+z.

Conclude that the necessary and sufficient conditions for a quadratic to exist in interval I is:

$$\forall t \max_{x<y,x+y=t} d(x, y) < \min_{x<y,x+y=t} d(y, x)$$

and $$\max_{t<s} \frac{\max\limits_{u<z,q+z=s} d(q, z) - \min\limits_{x<y,x+y=t} d(y, x)}{s - t} < \min_{t<s} \frac{\min\limits_{u<z,q+z=s} d(z, q) - \max\limits_{x<y,x+y=t} d(x, y)}{s - t}$$

Simplifying yields necessary and sufficient conditions for quadratic existence:

Let $M(t) =$ $$\max_{x<y,x+y=t} \frac{u(R + x) + 1 - l(R + y)}{x - y} \quad m(t) = \min_{x<y,x+y=t} \frac{u(R + y) + 1 - l(R + x)}{y - x}$$

$$\forall t, M(t) < m(t) \text{ and } \max_{t<s} \frac{M(s) - m(t)}{s - t} < \min_{t<s} \frac{m(s) - M(t)}{s - t}$$

Once a quadratic is known to exist:

$$\text{Find } a \text{ and } k: \max_{t<s} \frac{M(s) - m(t)}{s - t} < \frac{a}{2^k} < \min_{t<s} \frac{m(s) - M(t)}{s - t}$$

Find b: $\max\limits_{t} 2^k M(t) - at < b <$ $$\min_{t} 2^k m(t) - at \text{ from (2) (increase } k \text{ if required)}$$

Find c: $\max\limits_{x} 2^k l(R + x) - ax^2 - bx \le c <$ $$\min_{x} 2^k (u(R + x) + 1) - ax^2 - bx \text{ from (1)} \quad 55$$

To generate the complete dictionary of LUTs, the proposed method may find all possible quadratic polynomials that fit between the upper and lower bounds within a region. This is finite since the polynomial coefficients are integers, that must meet the constraints described by the above equations.

For each region, a set of a values may be generated from the square term in our quadratic. For each a value an associated set of b values may be generated and for each (a,b) pair, a range of c values may be generated. The feasible coefficient values may be discovered using a sequence of 2D searches (over each region) within the constraints described above.

Many

Figure 5:
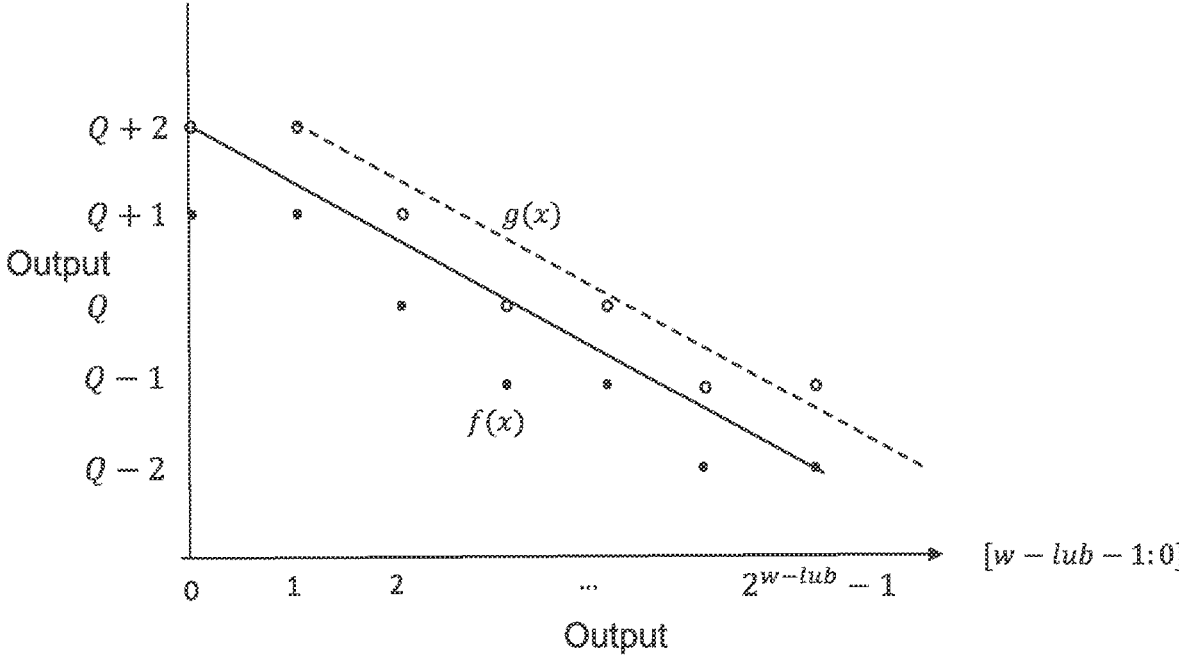
FIG. 5 shows an example of an improvement of a proposed 2D search method.

Many of the 2D searches are of the form $\max\limits_{x<y} \dfrac{g(y) - f(x)}{y - x}$, which asks for the shallowest negative slope on a graph. An improvement or optimization can be deployed to speed up such searches. FIG. 5 shows that many points from the 2D search can be discounted, since, if the best slope is found at, an improved slope might not be found at any point above this line. FIG. 5 shows an example of an improvement of the proposed 2D search method. In FIG. 5, the solid line shows the best slope for x=0. In this case, there may be no need to check for x=1, since, then a solid dot would be above the dashed line. However, in this case, the old line could have improved. In other words, in FIG. 5, there is no need check points above the solid line because if they offered an improved slope then the original solid line could also have improved, representing a contradiction.

For each region, a set of polynomials (i.e., the set of polynomial approximations) of the form (ax²+bx+c)>>k have now been determined. Now, it is to be decided how many regions and which polynomial within each region to implement in hardware, e.g., by (iteratively) removing polynomial approximations from the respective sets of polynomial approximations.

Other parts of the design can be improved or optimized since we have the freedom to choose which polynomials we use. See FIG. 6 for design improvements or optimizations that may be performed according to the proposed concept. These improvements or optimizations describe a co-design of polynomial choice and polynomial evaluation, which enable a designer or design software to efficiently explore design space. This design space exploration is valuable, as the optimal design to synthesize may not correspond to the smallest LUT, depending on the target e.g., minimal area or delay. The square and LUT may process in parallel, so the critical path can be non-obvious with respect to delay improvement or optimization. Understanding the complete LUT space may allow to exploit freedoms in polynomial choice resulting in better hardware.

Figure 6:
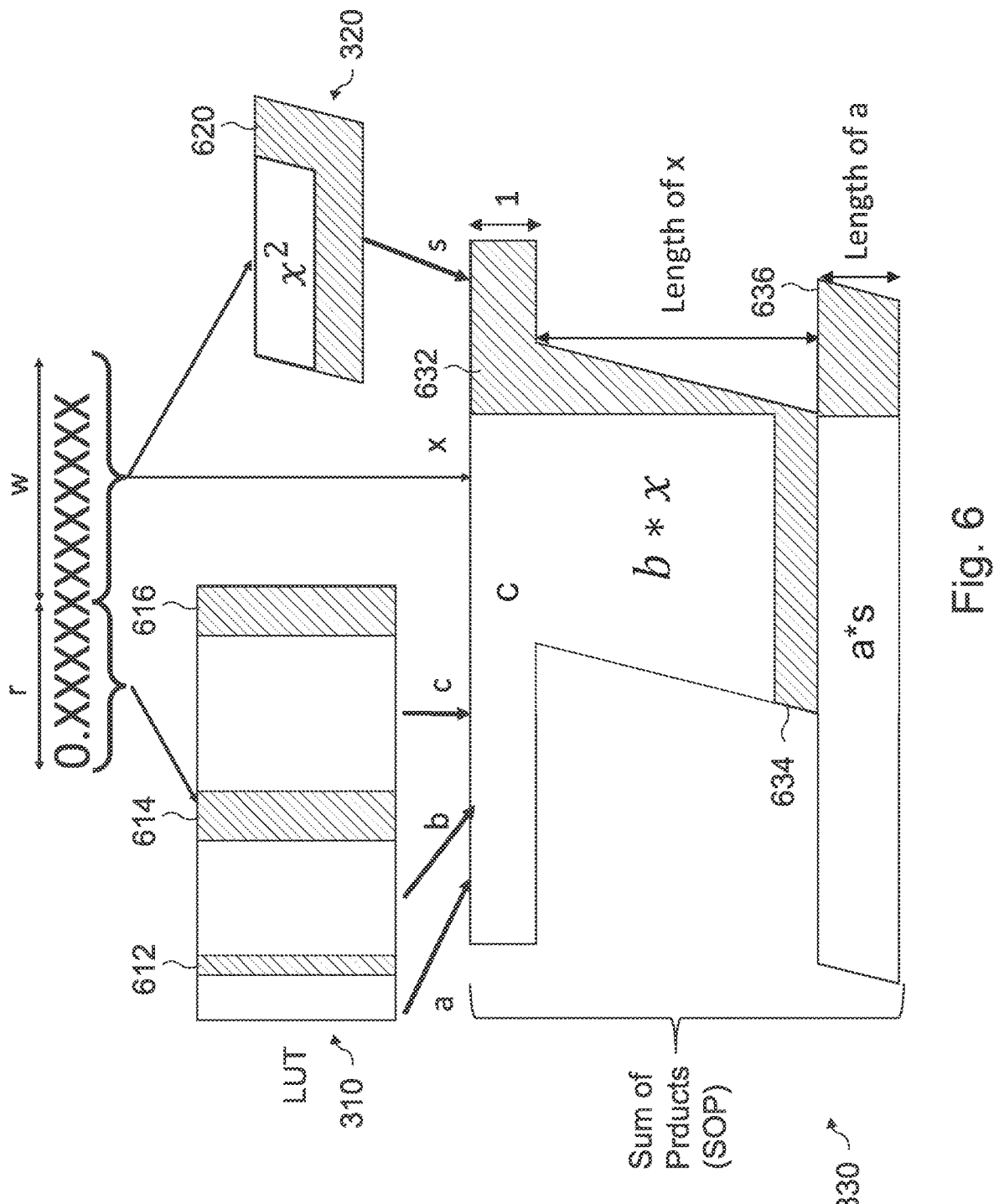
FIG. 6 shows an overview of improvements performed after the design space of the LUT has been determined.

FIG. 6 shows an overview of improvements performed after the design space of the LUT has been determined. The precision may be reduced in any part of the design (while still reaching the desired accuracy), resulting in better hardware (with respect to the respective target metrics). In particular, the precision may be used by one or more of computing the minimal r within user range, shrinking input to the square component, shrinking input to the linear term, shrinking precision of a, b, or c, internally truncating the Sum of Products, use linear polynomials where possible and/or merging adjacent regions using same poly.

In the following, an example decision procedure for design space exploration is shown. (1) k may be reduced or minimized—reduces polynomial evaluation output size and size of multiplication arrays (by portion 636). (2) Square input width may be reduced or minimized—reduces size of square term array (resulting in reduction of square calculation hardware by portion 620). (3) Linear input width may be reduced or minimized—reduces size of multiplication array (by portion 634). (4) The precision of a and then of b may be reduced or minimized—reduces width of LUT (by portions 612 and 614). (5) The internal SOP array truncation may be increased or maximized (by portions 632). (6) The precision of c may be decreased or minimized—reduces size of LUT by portion 616). Finally (7), the entries for the LUT may be chosen.

The above order is an example. A different order may be chosen, or a subset of the tasks listed above may be used.

Coefficient precision minimization may use the following algorithm for each coefficient a, b, c separately, where for each region a set of feasible coefficients may be obtained. First, the maximum number of trailing zeros for the given coefficient across all regions may be identified. Then, for each number of trailing zeros, the minimal precision may be determined. This may be repeated for the subspace of positive and negative coefficients. In the end, the best coefficients may be chosen.

For example, in region 1, a may be chosen to be $\{111, 1000\}$, and in region 2, a may be chosen to be $\{10,11,100\}$—maximum number of trailing zeros is 2. Thus, $\{1000\}$ may be chosen for region 1, and $\{100\}$ may be chosen for region 2. With 0 zeros removed, the best is 3 bits, with 1 zero removed, the best is 3 bits. With 2 zeros removed, the best is 2 bits. A bit-shift (e.g., a>>2) may be used on the result, e.g., to get from $\{10\}$ to $\{1000\}$ and from $\{01\}$ to $\{0100\}$.

Figures 7A, 7B:
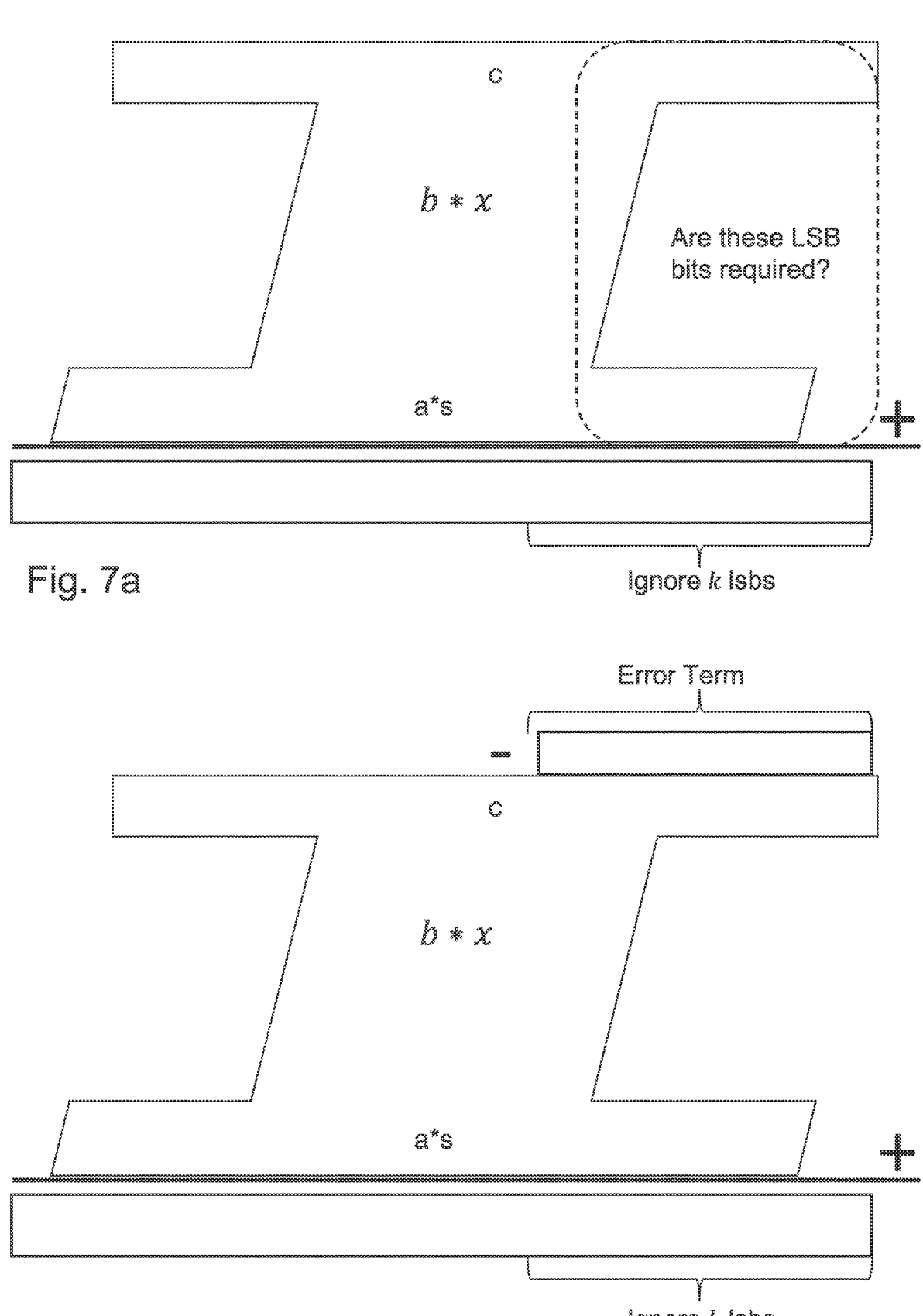
FIGS. 7a to 7d shows an example of truncated interpolation.
Figure 7C:
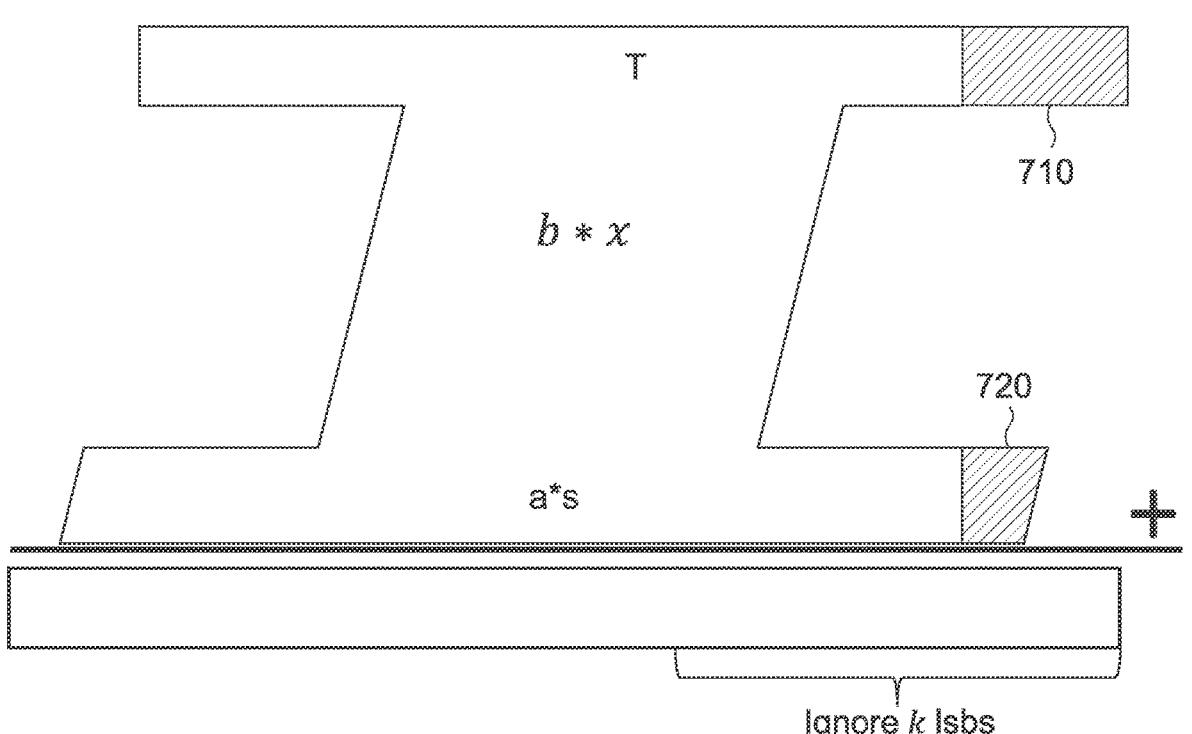
Figure 7D:
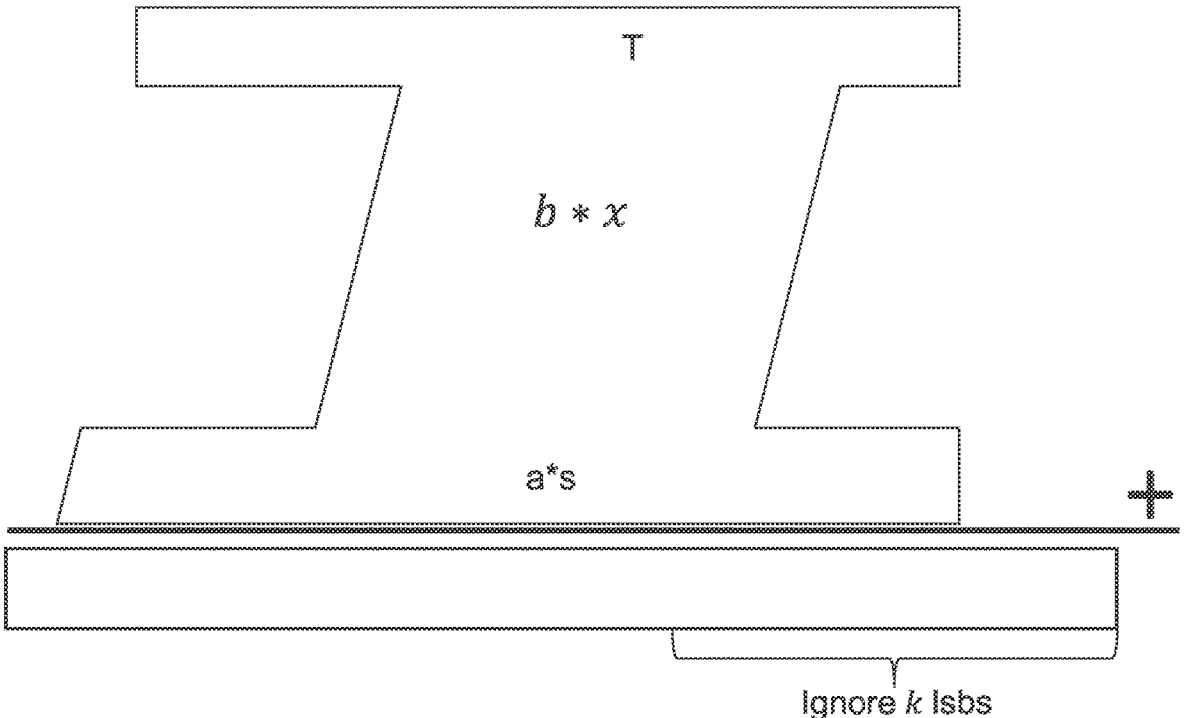

In the following, in connection with FIGS. 7a to 7d, an example for truncated interpolation is given. FIGS. 7a to 7d shows an example of truncated interpolation. In FIG. 7a, the "normal" (non-truncated) interpolation is shown. k least significant bits (LSB) of the result are ignored (due to the bit shift occurring at the end). During improvement or optimization, it may be determined whether the LSBs of the SOP are required. For example, as shown in FIG. 7b, if c is known to be in [S,T], with $0 \leq Error \leq T-S$. As long as $Error \leq T-S$, the proposed scheme works. As shown in Fig. c, c may be truncated to T 710. As long as the sum of these bits$\leq T-S$, these can be deleted. The resulting truncated interpolation is shown in FIG. 7d.

Figure 8:
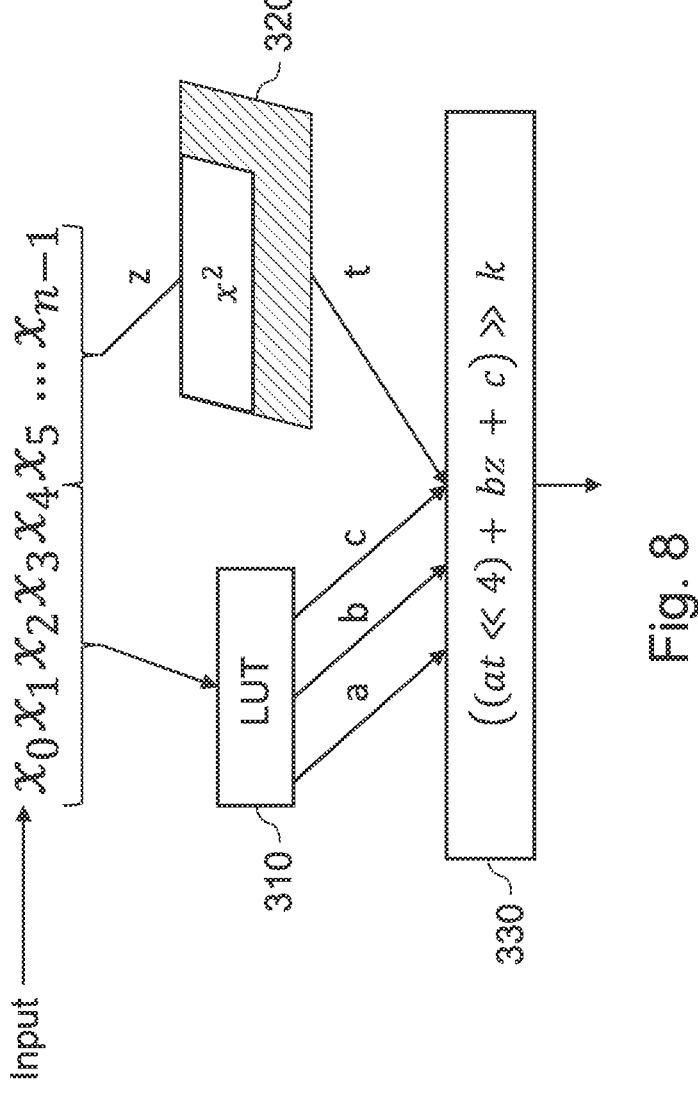
FIG. 8 shows an example of square truncation.

In the following, an example for square truncation is shown. FIG. 8 shows an example of square truncation. Conceptually, in $(c+bx+ax^2)>>k$, the square term $x^2$ is an "adjustment". In some cases, the full adjustment might not be required. For example, for a given input $x_0x_1x_2x_3x_4 x_5 \dots x_{n-1}$, how much can be truncated? For example, for a given a and c value, b in $[b_0, b_1]$ can be used. If $b=b_1$ is set, this gives an error freedom of $|b_1-b_0|x$. Deleting 1 bits from x in the square loses $|a|(x^2-(2^ix[n-1:l])^2)$. The maximal 1 that keeps within the error freedom may then be used.

The proposed concept highlights the power of complete design space knowledge and provides an example of how this space can be efficiently explored. The result is a powerful technique to generate efficient hardware approximations to arbitrary functions.

In general, every implementation of a polynomial interpolation hardware generated according to the proposed concept has a signature. For example, if the error requirement is 1 unit in the last place (ULP), that means that for every input the implementation's output can be one of two allowed values. Therefore, a faithfully rounded design with n input bits can be implemented in $2^n$ distinct ways in theory. The exact bit accurate behavior of an implementation is then its 'signature'. Any implementation of a polynomial interpolation hardware generated according to the proposed concept will have a particular signature.

More details and aspects of the concept for automatic generation of improved or optimal polynomial interpolation hardware are mentioned in connection with the proposed concept or one or more examples described above or below (e.g., FIG. 1a to 1b). The concept for automatic generation of improved or optimal polynomial interpolation hardware may comprise one or more additional optional features corresponding to one or more aspects of the proposed concept, or one or more examples described above or below.

In the following, some examples are presented:

An example (e.g., example 1) relates to an apparatus (10) for generating a circuit design of polynomial interpolation hardware, the apparatus comprising processing circuitry (14) configured to sub-divide the range of input values of the polynomial interpolation hardware into a plurality of regions. The processing circuitry is configured to determine, for each region of the plurality of regions, a set of polynomial approximations that are suitable in view of a desired accuracy of the polynomial interpolation hardware. The processing circuitry is configured to remove, based on one or more user-defined objectives, polynomial approximations from the respective sets of polynomial approximations. The processing circuitry is configured to generate the circuit design of the polynomial interpolation hardware based on one polynomial approximation per region remaining in the respective sets of polynomial approximations after the iterative removal of polynomial approximations.

Another example (e.g., example 1a) relates to a previously described example (e.g., example 1) or to any of the examples described herein, further comprising that the processing circuitry is configured to iteratively remove the polynomial approximations from the respective sets of polynomial approximations.

Another example (e.g., example 2) relates to a previously described example (e.g., one of the examples 1 or 1a) or to any of the examples described herein, further comprising that the polynomial approximations being used for the circuit design define entries of a look-up table used in the polynomial interpolation hardware.

Another example (e.g., example 3) relates to a previously described example (e.g., one of the examples 1 to 2) or to any of the examples described herein, further comprising that the sets of polynomial approximations define an overall design space of the circuit design of the polynomial interpolation hardware, with the design space being gradually decreased by (iteratively) removing the polynomial approximations from the respective sets of polynomial approximations.

Another example (e.g., example 4) relates to a previously described example (e.g., one of the examples 1 to 3) or to any of the examples described herein, further comprising that the one or more user-defined objectives are based on properties of a target hardware platform.

Another example (e.g., example 5) relates to a previously described example (e.g., one of the examples 1 to 4) or to any of the examples described herein, further comprising that the one or more user-defined objectives are based on one or more of an area required for implementing components of the polynomial interpolation hardware, a processing delay of components of the polynomial interpolation hardware, and an availability of fixed-function hardware for implementing components of the polynomial interpolation hardware.

Another example (e.g., example 6) relates to a previously described example (e.g., one of the examples 1 to 5) or to any of the examples described herein, further comprising that the polynomial interpolation hardware comprises a look-up-table, a computational block for determining a square of a term, and a computational block for determining a multiplication, wherein the one or more user-defined objectives relate to reducing a width or complexity of at least one of the look-up-table, the computational block for calculating the square of the term, and the computational block for calculating the multiplication.

Another example (e.g., example 7) relates to a previously described example (e.g., example 6) or to any of the examples described herein, further comprising that the one or more user-defined objectives comprise at least one of an objective related to reducing an input width of the computational block for calculating the square of the term, an objective related to reducing a linear component input width of the computational block for calculating the multiplication, an objective related to reducing a width of entries of the look-up table, and an objective related to reducing a precision of the computational block for calculating the multiplication.

Another example (e.g., example 8) relates to a previously described example (e.g., one of the examples 6 to 7) or to any of the examples described herein, further comprising that the polynomial interpolation hardware comprises a bit-shifting component, with the one or more user-defined objectives comprising an objective related to reducing an extent of the bit shift.

Another example (e.g., example 9) relates to a previously described example (e.g., one of the examples 1 to 8) or to any of the examples described herein, further comprising that the application of a user-defined objective reduces an overall accuracy of the polynomial interpolation hardware, so that the polynomial approximations that are suitable in view of the desired accuracy of the polynomial interpolation hardware are limited by the overall accuracy of the polynomial interpolation hardware.

Another example (e.g., example 10) relates to a previously described example (e.g., one of the examples 1 to 9) or to any of the examples described herein, further comprising that the plurality of polynomials are defined by three coefficients a, b, and c, with the plurality of polynomials having the form of $(ax^2+bx+c)>>k$, with k defining an extent of a bit-shift applied on the polynomial, the bit-shift having an influence on the precision of an evaluation of the polynomial.

Another example (e.g., example 11) relates to a previously described example (e.g., example 10) or to any of the examples described herein, further comprising that the coefficients define entries of a look-up table used by the polynomial interpolation hardware.

Another example (e.g., example 12) relates to a previously described example (e.g., one of the examples 10 or 11) or to any of the examples described herein, further comprising that the processing circuitry is configured to determine a plurality of values for coefficient a, to determine for each value of coefficient a a plurality of values for coefficient b, and for each combination of coefficients a and b a plurality of values for coefficient c, with each combination of a, b and c defining a polynomial approximation.

Another example (e.g., example 13) relates to a previously described example (e.g., example 12) or to any of the examples described herein, further comprising that the processing circuitry is configured to sub-divide the bits of the input value into a first range of most significant bits r and a second range of least significant bits w, with r bits being used as key for the look-up table.

Another example (e.g., example 14) relates to a previously described example (e.g., example 13) or to any of the examples described herein, further comprising that the processing circuitry is configured to sub-divide the range of input values of the polynomial interpolation hardware into the plurality of regions based on the first range of most significant bits r.

Another example (e.g., example 15) relates to a previously described example (e.g., one of the examples 13 or 14) or to any of the examples described herein, further comprising that the processing circuitry is configured to sub-divide the bits of the input value such, that a combination of coefficients a, b and c and shift value k exists that define suitable sets of polynomial approximations that cover the plurality of regions, with the processing circuitry being configured to determine the coefficients a, b and c based on the sub-division of the bits of the input value.

Another example (e.g., example 16) relates to a previously described example (e.g., one of the examples 10 to 15) or to any of the examples described herein, further comprising that the processing circuitry is configured to determine the coefficients a, b and c and shift value k based on three inequalities defining ranges of possible values for coefficients a, b and c and shift value k, with the inequalities being defined by lower bounds and upper bounds being based on the desired accuracy of the polynomial interpolation hardware.

Another example (e.g., example 17) relates to a previously described example (e.g., one of the examples 1 to 16) or to any of the examples described herein, further comprising that the processing circuitry is configured to determine, for each region of the plurality of regions, a set of quadratic polynomial approximations that are suitable in view of a desired accuracy of the polynomial interpolation hardware.

Another example (e.g., example 18) relates to a previously described example (e.g., one of the examples 1 to 17) or to any of the examples described herein, further comprising that the processing circuitry is configured to determine, for each region of the plurality of regions, a set of linear polynomial approximations that are suitable in view of a desired accuracy of the polynomial interpolation hardware.

An example (e.g., example 19) relates to a computer system (100) comprising the apparatus (10) according to one of the examples 1 to 18 (or according to any other example).

An example (e.g., example 20) relates to a device (10) for generating a circuit design of polynomial interpolation hardware, the device comprising means for processing (14) configured to sub-divide the range of input values of the polynomial interpolation hardware into a plurality of regions. The means for processing is configured to determine, for each region of the plurality of regions, a set of polynomial approximations that are suitable in view of a desired accuracy of the polynomial interpolation hardware. The means for processing is configured to remove, based on one or more user-defined objectives, polynomial approximations from the respective sets of polynomial approximations. The means for processing is configured to generate the circuit design of the polynomial interpolation hardware based on one polynomial approximation per region remaining in the respective sets of polynomial approximations after the iterative removal of polynomial approximations.

Another example (e.g., example 20a) relates to a previously described example (e.g., example 20) or to any of the examples described herein, further comprising that the means for processing is configured to iteratively remove the polynomial approximations from the respective sets of polynomial approximations.

Another example (e.g., example 21) relates to a previously described example (e.g., one of the examples 20 or 20a) or to any of the examples described herein, further comprising that the polynomial approximations being used for the circuit design define entries of a look-up table used in the polynomial interpolation hardware.

Another example (e.g., example 22) relates to a previously described example (e.g., one of the examples 20 to 21) or to any of the examples described herein, further comprising that the sets of polynomial approximations define an overall design space of the circuit design of the polynomial interpolation hardware, with the design space being gradually decreased by (iteratively) removing the polynomial approximations from the respective sets of polynomial approximations.

Another example (e.g., example 23) relates to a previously described example (e.g., one of the examples 20 to 22) or to any of the examples described herein, further comprising that the one or more user-defined objectives are based on properties of a target hardware platform.

Another example (e.g., example 24) relates to a previously described example (e.g., one of the examples 20 to 23) or to any of the examples described herein, further comprising that the one or more user-defined objectives are based on one or more of an area required for implementing components of the polynomial interpolation hardware, a processing delay of components of the polynomial interpolation hardware, and an availability of fixed-function hardware for implementing components of the polynomial interpolation hardware.

Another example (e.g., example 25) relates to a previously described example (e.g., one of the examples 20 to 24) or to any of the examples described herein, further comprising that the polynomial interpolation hardware comprises a look-up-table, a computational block for determining a square of a term, and a computational block for determining a multiplication, wherein the one or more user-defined objectives relate to reducing a width or complexity of at least one of the look-up-table, the computational block for calculating the square of the term, and the computational block for calculating the multiplication.

Another example (e.g., example 26) relates to a previously described example (e.g., example 25) or to any of the examples described herein, further comprising that the one or more user-defined objectives comprise at least one of an objective related to reducing an input width of the computational block for calculating the square of the term, an objective related to reducing a linear component input width of the computational block for calculating the multiplication, an objective related to reducing a width of entries of the look-up table, and an objective related to reducing a precision of the computational block for calculating the multiplication.

Another example (e.g., example 27) relates to a previously described example (e.g., one of the examples 25 to 26) or to any of the examples described herein, further comprising that the polynomial interpolation hardware comprises a bit-shifting component, with the one or more user-defined objectives comprising an objective related to reducing an extent of the bit shift.

Another example (e.g., example 28) relates to a previously described example (e.g., one of the examples 20 to 25) or to any of the examples described herein, further comprising that the application of a user-defined objective reduces an overall accuracy of the polynomial interpolation hardware, so that the polynomial approximations that are suitable in view of the desired accuracy of the polynomial interpolation hardware are limited by the overall accuracy of the polynomial interpolation hardware.

Another example (e.g., example 29) relates to a previously described example (e.g., one of the examples 20 to 28) or to any of the examples described herein, further comprising that the plurality of polynomials are defined by three coefficients a, b, and c, with the plurality of polynomials having the form of $(ax^2+bx+c)>>k$, with k defining an extent of a bit-shift applied on the polynomial, the bit-shift having an influence on the precision of an evaluation of the polynomial.

Another example (e.g., example 30) relates to a previously described example (e.g., example 29) or to any of the examples described herein, further comprising that the coefficients define entries of a look-up table used by the polynomial interpolation hardware.

Another example (e.g., example 31) relates to a previously described example (e.g., one of the examples 30 or 31) or to any of the examples described herein, further comprising that the means for processing is configured to determine a plurality of values for coefficient a, to determine for each value of coefficient a a plurality of values for coefficient b, and for each combination of coefficients a and b a plurality of values for coefficient c, with each combination of a, b and c defining a polynomial approximation.

Another example (e.g., example 32) relates to a previously described example (e.g., example 31) or to any of the examples described herein, further comprising that an input value of the polynomial interpolation hardware has a predefined bit-width, wherein the means for processing is configured to sub-divide the bits of the input value into a first range of most significant bits r and a second range of least significant bits w, with r bits being used as key for the look-up table.

Another example (e.g., example 33) relates to a previously described example (e.g., example 32) or to any of the examples described herein, further comprising that the means for processing is configured to sub-divide the range of input values of the polynomial interpolation hardware into the plurality of regions based on the first range of most significant bits r.

Another example (e.g., example 34) relates to a previously described example (e.g., one of the examples 32 or 33) or to any of the examples described herein, further comprising that the means for processing is configured to sub-divide the bits of the input value such, that a combination of coefficients a, b and c and shift value k exists that define suitable sets of polynomial approximations that cover the plurality of regions, with the means for processing being configured to determine the coefficients a, b and c based on the sub-division of the bits of the input value.

Another example (e.g., example 35) relates to a previously described example (e.g., one of the examples 29 to 34) or to any of the examples described herein, further comprising that the means for processing is configured to determine the coefficients a, b and c and shift value k based on three inequalities defining ranges of possible values for coefficients a, b and c and shift value k, with the inequalities being defined by lower bounds and upper bounds being based on the desired accuracy of the polynomial interpolation hardware.

Another example (e.g., example 36) relates to a previously described example (e.g., one of the examples 20 to 35) or to any of the examples described herein, further comprising that the means for processing is configured to determine, for each region of the plurality of regions, a set of quadratic polynomial approximations that are suitable in view of a desired accuracy of the polynomial interpolation hardware.

Another example (e.g., example 37) relates to a previously described example (e.g., one of the examples 20 to 36) or to any of the examples described herein, further comprising that the means for processing is configured to determine, for each region of the plurality of regions, a set of linear polynomial approximations that are suitable in view of a desired accuracy of the polynomial interpolation hardware.

An example (e.g., example 38) relates to a computer system (100) comprising the device (10) according to one of the examples 20 to 37 (or according to any other example).

An example (e.g., example 39) relates to a method for generating a circuit design of polynomial interpolation hardware, the method comprising sub-dividing (120) the range of input values of the polynomial interpolation hardware into a plurality of regions. The method comprises determining (130), for each region of the plurality of regions, a set of polynomial approximations that are suitable in view of a desired accuracy of the polynomial interpolation hardware. The method comprises removing (140), based on one or more user-defined objectives, polynomial approximations from the respective sets of polynomial approximations. The method comprises generating (150) the circuit design of the polynomial interpolation hardware based on one polynomial approximation per region remaining in the respective sets of polynomial approximations after the iterative removal of polynomial approximations.

Another example (e.g., example 39a) relates to a previously described example (e.g., example 39) or to any of the examples described herein, further comprising that the polynomial approximations are removed iteratively from the respective sets of polynomial approximations.

Another example (e.g., example 40) relates to a previously described example (e.g., one of the examples 39 or 39a) or to any of the examples described herein, further comprising that the polynomial approximations being used for the circuit design define entries of a look-up table used in the polynomial interpolation hardware.

Another example (e.g., example 41) relates to a previously described example (e.g., one of the examples 39 to 40) or to any of the examples described herein, further comprising that the sets of polynomial approximations define an overall design space of the circuit design of the polynomial interpolation hardware, with the design space being gradually decreased by (iteratively) removing the polynomial approximations from the respective sets of polynomial approximations.

Another example (e.g., example 42) relates to a previously described example (e.g., one of the examples 39 to 41) or to any of the examples described herein, further comprising that the one or more user-defined objectives are based on properties of a target hardware platform.

Another example (e.g., example 43) relates to a previously described example (e.g., one of the examples 39 to 42) or to any of the examples described herein, further comprising that the one or more user-defined objectives are based on one or more of an area required for implementing components of the polynomial interpolation hardware, a processing delay of components of the polynomial interpolation hardware, and an availability of fixed-function hardware for implementing components of the polynomial interpolation hardware.

Another example (e.g., example 44) relates to a previously described example (e.g., one of the examples 39 to 43) or to any of the examples described herein, further comprising that the polynomial interpolation hardware comprises a look-up-table, a computational block for determining a square of a term, and a computational block for determining a multiplication, wherein the one or more user-defined objectives relate to reducing a width or complexity of at least one of the look-up-table, the computational block for calculating the square of the term, and the computational block for calculating the multiplication.

Another example (e.g., example 45) relates to a previously described example (e.g., example 44) or to any of the examples described herein, further comprising that the one or more user-defined objectives comprise at least one of an objective related to reducing an input width of the computational block for calculating the square of the term, an objective related to reducing a linear component input width of the computational block for calculating the multiplication, an objective related to reducing a width of entries of the look-up table, and an objective related to reducing a precision of the computational block for calculating the multiplication.

Another example (e.g., example 46) relates to a previously described example (e.g., one of the examples 44 to 45) or to any of the examples described herein, further comprising that the polynomial interpolation hardware comprises a bit-shifting component, with the one or more user-defined objectives comprising an objective related to reducing an extent of the bit shift.

Another example (e.g., example 47) relates to a previously described example (e.g., one of the examples 39 to 46) or to any of the examples described herein, further comprising that the application of a user-defined objective reduces an overall accuracy of the polynomial interpolation hardware, so that the polynomial approximations that are suitable in view of the desired accuracy of the polynomial interpolation hardware are limited by the overall accuracy of the polynomial interpolation hardware.

Another example (e.g., example 48) relates to a previously described example (e.g., one of the examples 39 to 46) or to any of the examples described herein, further comprising that the plurality of polynomials are defined by three coefficients a, b, and c, with the plurality of polynomials having the form of $(ax^e+bx+c)\!\gg\!k$, with k defining an extent of a bit-shift applied on the polynomial, the bit-shift having an influence on the precision of an evaluation of the polynomial.

Another example (e.g., example 49) relates to a previously described example (e.g., example 48) or to any of the examples described herein, further comprising that the coefficients define entries of a look-up table used by the polynomial interpolation hardware.

Another example (e.g., example 50) relates to a previously described example (e.g., one of the examples 48 or 49) or to any of the examples described herein, further comprising that the method comprises determining (135) a plurality of values for coefficient a, to determine for each value of coefficient a a plurality of values for coefficient b, and for each combination of coefficients a and b a plurality of values for coefficient c, with each combination of a, b and c defining a polynomial approximation.

Another example (e.g., example 51) relates to a previously described example (e.g., example 50) or to any of the examples described herein, further comprising that an input value of the polynomial interpolation hardware has a predefined bit-width, wherein the method comprises sub-dividing (110) the bits of the input value into a first range of most significant bits r and a second range of least significant bits w, with r bits being used as key for the look-up table.

Another example (e.g., example 52) relates to a previously described example (e.g., example 51) or to any of the examples described herein, further comprising that the method comprises sub-dividing (120) the range of input values of the polynomial interpolation hardware into the plurality of regions based on the first range of most significant bits r.

Another example (e.g., example 53) relates to a previously described example (e.g., one of the examples 51 or 52) or to any of the examples described herein, further comprising that the method comprises sub-dividing (110) the bits of the input value such, that a combination of coefficients a, b and c and shift value k exists that define suitable sets of polynomial approximations that cover the plurality of regions, with the coefficients a, b and c being determined based on the sub-division of the bits of the input value.

Another example (e.g., example 54) relates to a previously described example (e.g., one of the examples 48 to 53) or to any of the examples described herein, further comprising that the method comprises determining (135) the coefficients a, b and c and shift value k based on three inequalities defining ranges of possible values for coefficients a, b and c and shift value k, with the inequalities being defined by lower bounds and upper bounds being based on the desired accuracy of the polynomial interpolation hardware.

Another example (e.g., example 55) relates to a previously described example (e.g., one of the examples 39 to 54) or to any of the examples described herein, further comprising that the method comprises determining (130), for each region of the plurality of regions, a set of quadratic polynomial approximations that are suitable in view of a desired accuracy of the polynomial interpolation hardware.

Another example (e.g., example 56) relates to a previously described example (e.g., one of the examples 39 to 55) or to any of the examples described herein, further comprising that the method comprises determining (130), for each region of the plurality of regions, a set of linear polynomial approximations that are suitable in view of a desired accuracy of the polynomial interpolation hardware.

An example (e.g., example 57) relates to a computer system (100) being configured to perform the method according to one of the examples 35 to 50 (or according to any other example).

An example (e.g., example 58) relates to a non-transitory machine-readable storage medium including program code, when executed, to cause a machine to perform the method of one of the examples 39 to 56 (or according to any other example).

An example (e.g., example 59) relates to a computer program having a program code for performing the method of one of the examples 39 to 56 (or according to any other example) when the computer program is executed on a computer, a processor, or a programmable hardware component.

An example (e.g., example 60) relates to a machine-readable storage including machine readable instructions, when executed, to implement a method or realize an apparatus as claimed in any pending claim or shown in any example.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor, or other programmable hardware component. Thus, steps, operations, or processes of different ones of the methods described above may also be executed by programmed computers, processors, or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations, or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process, or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

As used herein, the term "module" refers to logic that may be implemented in a hardware component or device, software or firmware running on a processing unit, or a combination thereof, to perform one or more operations consistent with the present disclosure. Software and firmware may be embodied as instructions and/or data stored on non-transitory computer-readable storage media. As used herein, the term "circuitry" can comprise, singly or in any combination, non-programmable (hardwired) circuitry, programmable circuitry such as processing units, state machine circuitry, and/or firmware that stores instructions executable by programmable circuitry. Modules described herein may, collectively or individually, be embodied as circuitry that forms a part of a computing system. Thus, any of the modules can be implemented as circuitry. A computing system referred to as being programmed to perform a method can be programmed to perform the method via software, hardware, firmware, or combinations thereof.

Any of the disclosed methods (or a portion thereof) can be implemented as computer-executable instructions or a computer program product. Such instructions can cause a computing system or one or more processing units capable of executing computer-executable instructions to perform any of the disclosed methods. As used herein, the term "computer" refers to any computing system or device described or mentioned herein. Thus, the term "computer-executable instruction" refers to instructions that can be executed by any computing system or device described or mentioned herein.

The computer-executable instructions can be part of, for example, an operating system of the computing system, an application stored locally to the computing system, or a remote application accessible to the computing system (e.g., via a web browser). Any of the methods described herein can be performed by computer-executable instructions performed by a single computing system or by one or more networked computing systems operating in a network environment. Computer-executable instructions and updates to the computer-executable instructions can be downloaded to a computing system from a remote server.

Further, it is to be understood that implementation of the disclosed technologies is not limited to any specific computer language or program. For instance, the disclosed technologies can be implemented by software written in C++, C#, Java, Perl, Python, JavaScript, Adobe Flash, C#, assembly language, or any other programming language. Likewise, the disclosed technologies are not limited to any particular computer system or type of hardware.

Furthermore, any of the software-based examples (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, cable (including fiber optic cable), magnetic communications, electromagnetic communications (including RF, microwave, ultrasonic, and infrared communications), electronic communications, or other such communication means.

The disclosed methods, apparatuses, and systems are not to be construed as limiting in any way. Instead, the present disclosure is directed toward all novel and nonobvious features and aspects of the various disclosed examples, alone and in various combinations and subcombinations with one another. The disclosed methods, apparatuses, and systems are not limited to any specific aspect or feature or combination thereof, nor do the disclosed examples require that any one or more specific advantages be present or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. An apparatus for generating a circuit design of polynomial interpolation hardware, the apparatus comprising processing circuitry configured to:

sub-divide the range of input values of the polynomial interpolation hardware into a plurality of regions;

determine, for each region of the plurality of regions, a set of polynomial approximations that are suitable in view of a desired accuracy of the polynomial interpolation hardware;

remove, based on one or more user-defined objectives, polynomial approximations from the respective sets of polynomial approximations; and generate the circuit design of the polynomial interpolation hardware based on one polynomial approximation per region remaining in the respective sets of polynomial approximations after the iterative removal of polynomial approximations.

2. The apparatus according to claim 1, wherein the processing circuitry is configured to iteratively remove the polynomial approximations from the respective sets of polynomial approximations.

3. The apparatus according to claim 1, wherein the polynomial approximations being used for the circuit design define entries of a look-up table used in the polynomial interpolation hardware.

4. The apparatus according to claim 1, wherein the sets of polynomial approximations define an overall design space of the circuit design of the polynomial interpolation hardware, with the design space being gradually decreased by removing the polynomial approximations from the respective sets of polynomial approximations.

5. The apparatus according to claim 1, wherein the one or more user-defined objectives are based on properties of a target hardware platform.

6. The apparatus according to claim 1, wherein the one or more user-defined objectives are based on one or more of an area required for implementing components of the polynomial interpolation hardware, a processing delay of components of the polynomial interpolation hardware, and an availability of fixed-function hardware for implementing components of the polynomial interpolation hardware.

7. The apparatus according to claim 1, wherein the polynomial interpolation hardware comprises a look-up-table, a computational block for determining a square of a term, and a computational block for determining a multiplication, wherein the one or more user-defined objectives relate to reducing a width or complexity of at least one of the look-up-table, the computational block for calculating the square of the term, and the computational block for calculating the multiplication.

8. The apparatus according to claim 7, wherein the one or more user-defined objectives comprise at least one of an objective related to reducing an input width of the computational block for calculating the square of the term, an objective related to reducing a linear component input width of the computational block for calculating the multiplication, an objective related to reducing a width of entries of the look-up table, and an objective related to reducing a precision of the computational block for calculating the multiplication.

9. The apparatus according to claim 7, wherein the polynomial interpolation hardware comprises a bit-shifting component, with the one or more user-defined objectives comprising an objective related to reducing an extent of the bit shift.

10. The apparatus according to claim 1, wherein the application of a user-defined objective reduces an overall accuracy of the polynomial interpolation hardware, so that the polynomial approximations that are suitable in view of the desired accuracy of the polynomial interpolation hardware are limited by the overall accuracy of the polynomial interpolation hardware.

11. The apparatus according to claim 1, wherein the plurality of polynomials are defined by three coefficients a, b, and c, with the plurality of polynomials having the form of $(ax^2+bx+c)>>k$, with k defining an extent of a bit-shift applied on the polynomial, the bit-shift having an influence on the precision of an evaluation of the polynomial.

12. The apparatus according to claim 11, wherein the coefficients define entries of a look-up table used by the polynomial interpolation hardware.

13. The apparatus according to claim 11, wherein the processing circuitry is configured to determine a plurality of values for coefficient a, to determine for each value of coefficient a a plurality of values for coefficient b, and for each combination of coefficients a and b a plurality of values for coefficient c, with each combination of a, b and c defining a polynomial approximation.

14. The apparatus according to claim 13, wherein an input value of the polynomial interpolation hardware has a pre-defined bit-width, wherein the processing circuitry is con-figured to sub-divide the bits of the input value into a first range of most significant bits r and a second range of least significant bits w, with r bits being used as key for the look-up table.

15. The apparatus according to claim 14, wherein the processing circuitry is configured to sub-divide the range of input values of the polynomial interpolation hardware into the plurality of regions based on the first range of most significant bits r.

16. The apparatus according to claim 14, wherein the processing circuitry is configured to sub-divide the bits of the input value such, that a combination of coefficients a, b and c and shift value k exists that define suitable sets of polynomial approximations that cover the plurality of regions, with the processing circuitry being configured to determine the coefficients a, b and c based on the sub-division of the bits of the input value.

17. The apparatus according to claim 11, wherein the processing circuitry is configured to determine the coeffi-cients a, b and c and shift value k based on three inequalities defining ranges of possible values for coefficients a, b and c and shift value k, with the inequalities being defined by lower bounds and upper bounds being based on the desired accuracy of the polynomial interpolation hardware.

18. The apparatus according to claim 1, wherein the processing circuitry is configured to determine, for each region of the plurality of regions, a set of quadratic poly-nomial approximations that are suitable in view of a desired accuracy of the polynomial interpolation hardware.

19. The apparatus according to claim 1, wherein the processing circuitry is configured to determine, for each region of the plurality of regions, a set of linear polynomial approximations that are suitable in view of a desired accu-racy of the polynomial interpolation hardware.

20. A method for generating a circuit design of polyno-mial interpolation hardware, the method comprising:

sub-dividing the range of input values of the polynomial interpolation hardware into a plurality of regions;

determining, for each region of the plurality of regions, a set of polynomial approximations that are suitable in view of a desired accuracy of the polynomial interpo-lation hardware;

removing, based on one or more user-defined objectives, polynomial approximations from the respective sets of polynomial approximations; and generating the circuit design of the polynomial interpo-lation hardware based on one polynomial approxima-tion per region remaining in the respective sets of polynomial approximations after the iterative removal of polynomial approximations.

21. A non-transitory machine-readable storage medium including program code, when executed, to cause a machine to perform the method of claim 20.

*    *    *    *    *